US009104278B2

(12) United States Patent
Oya

(10) Patent No.: US 9,104,278 B2
(45) Date of Patent: Aug. 11, 2015

(54) CAPACITANCE-TYPE PROXIMITY SENSOR DEVICE AND ELECTRONIC APPARATUS USING THE SAME

(75) Inventor: Junichiro Oya, Miyagi-ken (JP)

(73) Assignee: ALPS ELECTRIC CO., LTD., Tokyo (JP)

( * ) Notice: Subject to any disclaimer, the term of this patent is extended or adjusted under 35 U.S.C. 154(b) by 596 days.

(21) Appl. No.: 13/547,723

(22) Filed: Jul. 12, 2012

(65) Prior Publication Data

US 2012/0280698 A1 Nov. 8, 2012

Related U.S. Application Data

(63) Continuation of application No. PCT/JP2011/050397, filed on Jan. 13, 2011.

(30) Foreign Application Priority Data

Jan. 13, 2010 (JP) ................................ 2010-004600

(51) Int. Cl.

| | |
|---|---|
| ***G01R 27/26*** | (2006.01) |
| ***G06F 3/044*** | (2006.01) |
| ***G01D 5/24*** | (2006.01) |
| ***G01D 5/241*** | (2006.01) |
| ***G06F 3/0354*** | (2013.01) |

(52) U.S. Cl.

CPC *G06F 3/044* (2013.01); *G01D 5/24* (2013.01); *G01D 5/2417* (2013.01); *G01R 27/2605* (2013.01); *G06F 3/03547* (2013.01); *G06F 2203/04108* (2013.01)

(58) Field of Classification Search

CPC ... G06F 3/03547; G06F 3/0412; G06F 3/044; G06F 3/045; G06F 3/0488; G06F 2203/04108; G01D 5/24; G01D 5/2417; G06K 9/0002; G01R 27/2605; H03K 17/955

USPC ......... 324/658, 649, 600, 661, 678, 686, 663; 702/47, 52; 345/173, 174

See application file for complete search history.

(56) References Cited

U.S. PATENT DOCUMENTS 6,392,330 B1 * 5/2002 Zloter et al. .................. 310/334
7,545,153 B2 6/2009 Abe

OTHER PUBLICATIONS

International Search Report issued in corresponding PCT Application No. PCT/JP2011/050397; mailed Feb. 8, 2011.

* cited by examiner

*Primary Examiner* — Hoai-An D Nguyen
(74) *Attorney, Agent, or Firm* — Brinks Gilson & Lione

(57) ABSTRACT

A capacitance-type proximity sensor device includes internal electrodes that are arranged such that capacitance is formed therebetween, external electrodes that are arranged in the outer circumference of the internal electrodes, a driving circuit that outputs a driving voltage, a detecting circuit that detects an output signal, a multiplexer that connects an electrode serving as a driving electrode to the driving circuit, connects an electrode serving as a detecting electrode to the detecting circuit, and connects an electrode serving as a shielding electrode to the ground, and a CPU that calculates the position of an object to be detected. When the object to be detected is detected, the multiplexer changes the internal electrodes and the external electrodes to the detecting electrodes, the driving electrodes, and the shielding electrodes.

18 Claims, 12 Drawing Sheets

11 12 13 14d 14b 15 19 20 18 14a 13d 13a 13b 13c 14c 17 16 AMPLIFYING CIRCUIT A/D CONVERTER MULTIPLEXER DRIVING CIRCUIT CPU Y X Z

CPU
A/D CONVERTER
AMPLIFYING CIRCUIT
DRIVING CIRCUIT
MULTIPLEXER
11
12
13
13a
13b
13c
13d
14a
14b
14c
14d
15
16
17
18
19
20
X
Y
Z

X
Y
Z
14a
14b
14c
14d
13a
13b
13c
13d
SHIELDING ELECTRODE
DETECTING ELECTRODE
DRIVING ELECTRODE

CAPACITANCE-TYPE PROXIMITY SENSOR DEVICE AND ELECTRONIC APPARATUS USING THE SAME

CLAIM OF PRIORITY

This application is a Continuation of International Application No. PCT/JP2011/050397 filed on Jan. 13, 2012, which claims benefit of Japanese Patent Application No. 2010-004600 filed on Jan. 13, 2010. The entire contents of each application noted above are hereby incorporated by reference.

BACKGROUND

1. Field of the Disclosure

The present disclosure relates to a capacitance-type proximity sensor device that detects the approach of an object to be detected, and more particularly, to a capacitance-type proximity sensor device that can be appropriately used in a portable apparatus and an electronic apparatus using the same.

2. Description of the Related Art

As a device that detects an object to be detected, such as the human body, a capacitance-detection-type proximity sensor has been proposed which shields capacitance variation (external noise) in the directions other than a detection target direction and improves detection sensitivity (for example, see WO/2004/059343). The capacitance-detection-type proximity sensor includes two detecting electrodes that are arranged such that capacitances are formed between a ground potential and the detecting electrodes and shielding electrodes that are arranged around the two detecting electrodes and shield the detecting electrodes from a capacitance variation in the directions other than a detection direction. A detecting circuit that detects a difference value between output signals is connected to the two detecting electrodes and a shielding voltage applying circuit that applies a voltage is connected to the shielding electrodes.

When the object to be detected, such as the human body, is detected, the shielding voltage applying circuit applies a voltage to the shielding electrodes such that the shielding electrodes and the two detecting electrodes have the same potential. In this state, when the object to be detected approaches the detecting electrodes, capacitances Ca and Cb formed between the detecting electrodes and a ground potential are changed and signals corresponding to the capacitances Ca and Cb are output from the detecting electrodes. The difference value between two output signals is detected by the detecting circuit. In this way, the approach of the object to be detected is detected.

However, in recent years, the capacitance-detection-type proximity sensor has been applied to, for example, portable apparatuses and has been used when the user holds the portable apparatus with the hand. In this case, the capacitance-detection-type proximity sensor is used to detect an object to be detected with the hand of the user, which is a portion of the body of the user and also serves as the object to be detected, placed in the vicinity of the capacitance-detection-type proximity sensor. Therefore, for example, the holding position and holding state of the portable apparatus by the hand have a great effect as external noise on the output signal from the capacitance-type proximity sensor.

However, in the capacitance-detection-type proximity sensor disclosed in WO/2004/059343, external noise in the directions other than the detection target direction is not sufficiently reduced and it is difficult to obtain a sufficient performance when the capacitance-detection-type proximity sensor is used in, for example, a portable apparatus. In addition, for example of, when the usage environment of the portable apparatus is changed, it is necessary to calibrate the reference value of the output signal according to external noise in the usage environment.

SUMMARY

A capacitance-type proximity sensor device includes: a plurality of internal electrodes including a pair of X-axis internal electrodes that are arranged in a detection reference plane such that capacitance is formed between adjacent electrodes and are opposite to each other in an X-axis direction included in the detection reference plane and a pair of Y-axis internal electrodes that are arranged so as to be opposite to each other in a Y-axis direction which is included in the detection reference plane and is perpendicular to the X-axis direction; external electrodes that are arranged in the outer circumference of the plurality of internal electrodes such that capacitance is formed between adjacent electrodes; a driving circuit that outputs a driving voltage applied to an electrode serving as a driving electrode among the plurality of internal electrodes and the external electrodes; a detecting circuit that detects a signal output from an electrode serving as a detecting electrode among the plurality of internal electrodes and the external electrodes; a calculating unit that calculates the position of an object to be detected in the X-axis direction and the Y-axis direction of the object to be detected and a Z-axis direction perpendicular to the reference plane from the detection result of the detecting circuit; and a switching unit that connects the electrode serving as the driving electrode to the driving circuit, connects the electrode serving as the detecting electrode to the detecting circuit, and connects an electrode' serving as a shielding electrode among the plurality of internal electrodes and the external electrodes to the ground.

According to another aspect of the disclosure, there is provided an electrode driving method that is performed in a capacitance-type proximity sensor device including: a plurality of internal electrodes including a pair of X-axis internal electrodes that are arranged in a reference plane such that capacitance is formed between adjacent electrodes and are opposite to each other in an X-axis direction included in the reference plane and a pair of Y-axis internal electrodes that are arranged so as to be opposite to each other in a Y-axis direction which is included in the reference plane and is perpendicular to the X-axis direction; external electrodes that are arranged in the outer circumference of the plurality of internal electrodes such that capacitance is formed between adjacent electrodes; a driving circuit that outputs a driving voltage applied to an electrode serving as a driving electrode among the plurality of internal electrodes and the external electrodes; a detecting circuit that detects a signal output from an electrode serving as a detecting electrode among the plurality of internal electrodes and the external electrodes; and a calculating unit that calculates the position of an object to be detected in the X-axis direction and the Y-axis direction of the object to be detected and a Z-axis direction perpendicular to the reference plane from the detection result of the detecting circuit. The electrode driving method includes changing a connection state of the external electrodes depending on a detection pattern such that the external electrodes serve as the shielding electrodes or the detecting electrodes.

DESCRIPTION OF THE EXEMPLARY EMBODIMENTS

Hereinafter, embodiments of the invention will be described in detail with reference to the accompanying drawings.

Figure 1:
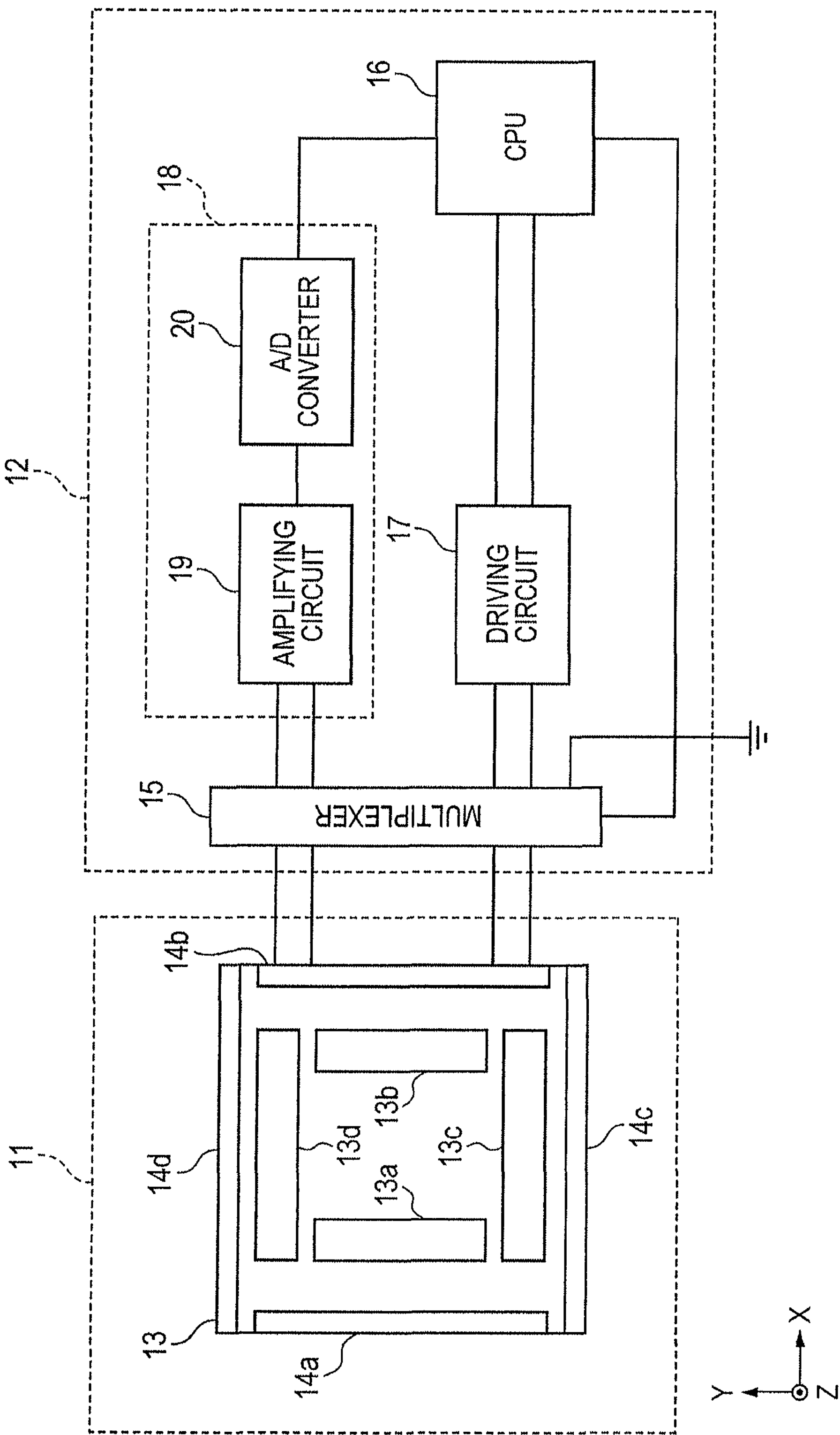
FIG. 1 is a diagram illustrating the structure of a capacitance-type proximity sensor device according to an embodiment of the invention.

FIG. 1 is a diagram illustrating the structure of a capacitance-type proximity sensor device according to an embodiment. As shown in FIG. 1, a proximity sensor device according to this embodiment includes a sensor unit 11 that detects the approach of an object to be detected and a control circuit unit 12 that calculates object position information on the basis of an output signal detected by the sensor unit 11.

The sensor unit 11 includes four internal electrodes 13*a* to 13*d* that are arranged such that capacitance is formed between adjacent electrodes and external electrodes 14*a* to 14*d* that are arranged outside the four internal electrodes 13*a* to 13*d* in a sensor surface 13. In this embodiment, the external electrodes 14*a* to 14*d* are used as shielding electrodes for shielding from, for example, external noise and are also used as driving electrodes and detecting electrodes for detecting the object to be detected. In this way, external noise is reduced and the accuracy of detecting object position information is improved.

The control circuit unit 12 includes a multiplexer 15 serving as means for changing the internal electrodes 13*a* to 13*d* and the external electrodes 14*a* to 14*d* of the sensor unit 11 and a CPU 16 serving as calculating means for calculating the position of the object to be detected on the basis of signals output from the internal electrodes 13*a* to 13*d* and the external electrodes 14*a* to 14*d*. A driving circuit 17 that applies a driving voltage to the internal electrodes 13*a* to 13*d* and the external electrodes 14*a* to 14*d* changed to the driving electrodes is provided between the CPU 16 and the multiplexer 15. In addition, a detecting circuit 18 that detects the output signals from the internal electrodes 13*a* to 13*d* and the external electrodes 14*a* to 14*d* changed to the detecting electrodes is provided between the CPU 16 and the multiplexer 15.

The multiplexer 15 is connected to the internal electrodes 13*a* to 13*d* and the external electrodes 14*a* to 14*d* of the sensor unit 11 and is also connected to the driving circuit 17 and the detecting circuit 18. In addition, the multiplexer 15 is connected to the CPU 16 and can change the connection of the internal electrodes 13*a* to 13*d* and the external electrodes 14*a* to 14*d* in response to a switching signal from the CPU 16. The multiplexer 15 connects the internal electrodes 13*a* to 13*d* and the external electrodes 14*a* to 14*d* (hereinafter, simply referred to as driving electrodes) serving as the driving electrodes to the driving circuit 17 and connects the internal electrodes 13*a* to 13*d* and the external electrodes 14*a* to 14*d* (hereinafter, simply referred to as detecting electrodes) serving as the detecting electrodes to the detecting circuit 18 in response to a switching control signal. In addition, the multiplexer 15 connects the internal electrodes 13*a* to 13*d* and the external electrodes 14*a* to 14*d* serving as the shielding electrode to the ground. Thus, in this embodiment, the multiplexer 15 can arbitrarily change the connection of the internal electrodes 13*a* to 13*d* and the external electrodes 14*a* to 14*d* to the driving circuit 17, the detecting circuit 18, and the ground.

The driving circuit 17 includes an oscillating circuit (not shown) and applies a driving voltage to the internal electrodes 13*a* to 13*d* and the external electrodes 14*a* to 14*d*, which are connected as the driving electrodes. The application timing of the driving voltage is controlled by the CPU 16.

The detecting circuit 18 detects the output signals from the internal electrodes 13*a* to 13*d* and the external electrodes 14*a* to 14*d* serving as the detecting electrodes. The detecting circuit 18 includes an amplifying circuit 19 having a positive terminal and a negative terminal and an A/D converter 20 which is connected to the amplifying circuit 19, converts an amplified output signal into a digital signal, and outputs the digital signal to the CPU 16.

The internal electrodes 13*a* to 13*d* and the external electrodes 14*a* to 14*d* serving as the detecting electrodes are connected to the positive and negative terminals of the amplifying circuit 19. The amplifying circuit 19 amplifies the output signals from the internal electrodes 13*a* to 13*d* and the external electrodes 14*a* to 14*d* serving as the detecting electrodes and outputs the amplified signals to the A/D converter 20.

In this embodiment, in the detection of the object position information in the X-axis direction included in the sensor surface 13, which is a detection reference plane, and the Y-axis direction perpendicular to the X-axis direction in the sensor surface 13, the multiplexer 15 connects a pair of detecting electrodes among the internal electrodes 13*a* to 13*d* and the external electrodes 14*a* to 14*d* to the amplifying circuit 19. Of the pair of detecting electrodes, one detecting electrode is connected to the positive terminal of the amplifying circuit 19 and the other detecting electrode is connected to the negative terminal. The amplifying circuit 19 differentially amplifies the output signal from the one detecting electrode and the output signal from the other detecting electrode.

When object position information in a height direction (Z-axis direction) perpendicular to the sensor surface 13 is detected, the multiplexer 15 connects at least one detecting electrode among the internal electrodes 13*a* to 13*d* and the external electrodes 14*a* to 14*d* to one terminal of the amplifying circuit 19. A reference voltage is input to the other terminal of the amplifying circuit 19. The amplifying circuit 19 amplifies the output signal using the difference between the output signal from the detecting electrode and the reference voltage.

Thus, in this embodiment, one amplifying circuit 19 time-divisionally switches amplification using the difference between the output signal from one detecting electrode and the output signal from the other detecting electrode and amplification using the difference between the output signal from the detecting electrode and the reference signal according to the detection direction. In this way, it is possible to detect the position of an object in the X-axis direction, the Y-axis direction, and the Z-axis direction without providing an amplifying circuit 19 for each axis. In addition, even when the difference value between the output signals from a pair of detecting electrodes used to detect the position of an object in the X-axis direction and the Y-axis direction is not obtained, it is possible to detect the object to be detected on the basis of the detected position in the Z-axis direction. Therefore, it is possible to complement a non-sensing region through the respective amplification characteristics.

The A/D converter 20 filters the output signal amplified by the amplifying circuit 19, converts the output signal into a digital signal, and outputs the digital signal to the CPU 16. The difference value between the output signals input to the CPU 16 is detected by the CPU 16 serving as a detecting circuit. However, the difference value may be detected by the A/D converter 20. In addition, the CPU 16 serving as a calculating unit calculates object position information in the three axis directions using the detected output signal.

Figure 2A:
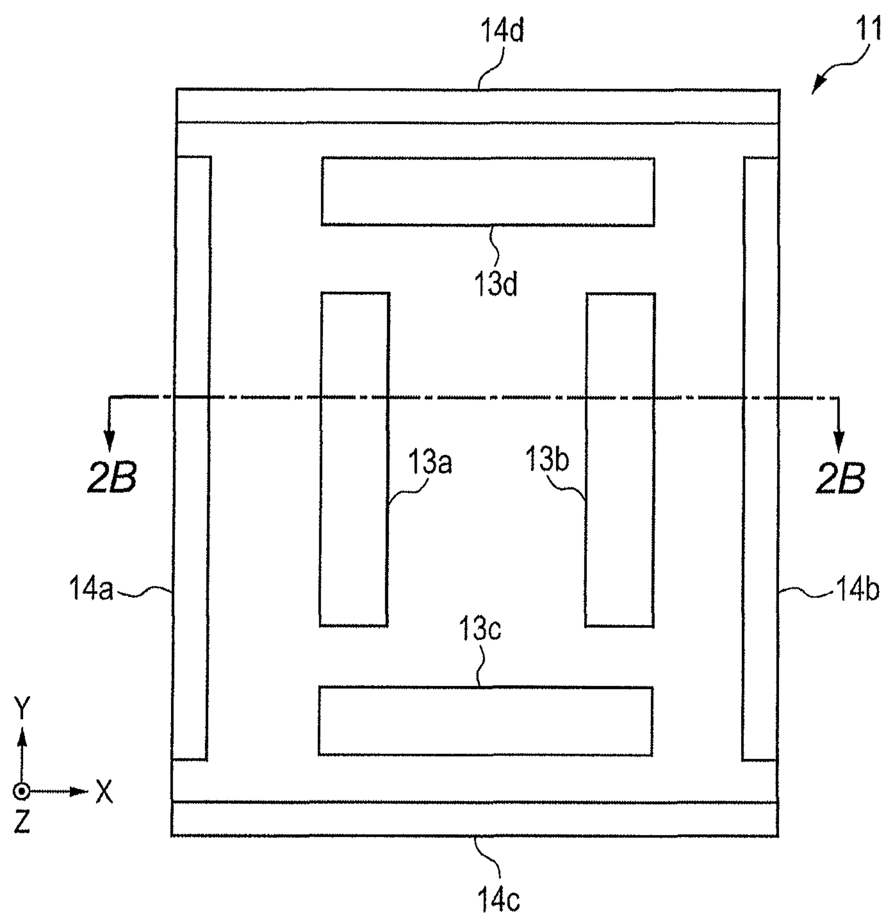
FIG. 2A is a diagram illustrating the arrangement of electrodes of a sensor unit in the capacitance-type proximity sensor device according to the embodiment of the invention.
Figure 2B:
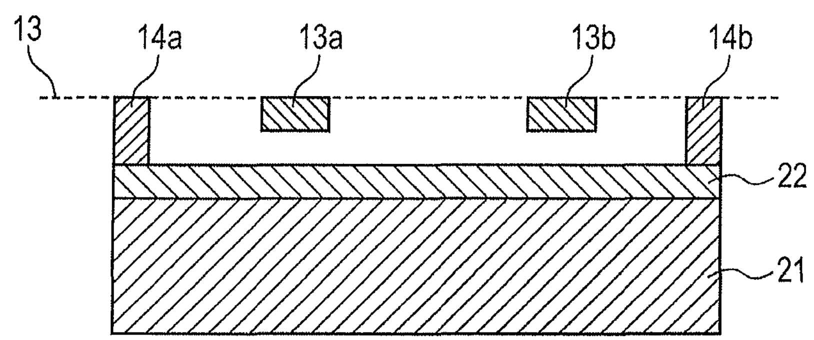
FIG. 2B is a cross-sectional view illustrating the sensor unit taken along the line A-A.

Next, the arrangement of the electrodes of the sensor unit 11 will be described with reference to FIG. 2A. FIG. 2A is a plan view illustrating the arrangement of the electrodes of the sensor unit 11 in the proximity sensor device according to this embodiment, and FIG. 2B is a cross-sectional view illustrating the sensor unit 11 taken along the line A-A of FIG. 2A. As shown in FIGS. 2A and 2B, the sensor unit 11 includes a base 21 having a substantially rectangular shape in a plan view and a lower electrode 22 that is provided on the base 21 and has a substantially rectangular shape in a plan view corresponding to the shape of the base 21. The lower electrode 22 covers the entire lower surface of the sensor unit 11 so as to shield the influence of, for example, noise from the rear side of the detection surface of the sensor unit 11 and is constantly connected to the ground.

The external electrodes 14*a* to 14*d* are arranged on four sides of the sensor unit 11 having a substantially rectangular shape in a plan view. The internal electrodes 13*a* to 13*d* are arranged inside the external electrodes 14*a* to 14*d* substantially in parallel to the external electrodes 14*a* to 14*d*. The internal electrodes 13*a* to 13*d* and the external electrodes 14*a* to 14*d* are separated from each other such that capacitance is formed between the electrodes. In addition, the upper surfaces of the internal electrodes 13*a* to 13*d* and the external electrodes 14*a* to 14*b* are arranged substantially on the same plane. The upper surfaces of the internal electrodes 13*a* to 13*d* and the external electrodes 14*a* to 14*b* are the sensor surface 13 serving as the detection reference plane.

That is, in this embodiment, the internal electrodes 13*a* and 13*b* are arranged substantially in parallel to two opposite sides of the sensor surface 13 having a substantially rectangular shape in a plan view. A pair of internal electrodes 13*c* and 13*d* are arranged on the other two opposite sides of the sensor surface 13 so as to be substantially perpendicular to the pair of internal electrodes 13*a* and 13*b*. In addition, a pair of external electrodes 14*a* and 14*b* are arranged outside the pair of internal electrodes 13*a* and 13*b* and the other pair of external electrodes 14*c* and 14*d* are arranged outside the other pair of internal electrodes 13*c* and 13*d*. Thus, the external electrodes 14*a* to 14*d* which are used as shielding electrodes for shielding the influence of a capacitance variation on the internal electrodes 13*a* to 13*d* from the outside and are also used as driving electrodes and detecting electrodes for detecting the object to be detected are arranged in the outer circumference of the internal electrodes 13*a* to 13*d*.

Next, the electrode pattern of the sensor unit 11 in the capacitance-type proximity sensor device according to this embodiment will be described in detail with reference to FIGS. 3A to 3C. In this embodiment, a combination of an electrode pattern in which the internal electrodes 13*a* to 13*d* are used as the detecting electrodes and the driving electrodes to detect the object to be detected and an electrode pattern in which the external electrodes 14*a* to 14*d* are used as the detecting electrodes and the driving electrodes to detect the object to be detected is used to detect the object to be detected. Thus, since each of the internal electrodes 13*a* to 13*d* and the external electrodes 14*a* to 14*d* is used to detect the object to be detected, it is possible to detect two kinds of object position information detected by the electrodes which are arranged in different environment. Each kind of object position information is used to correct the position of the object to be detected. Therefore, it is possible to accurately detect the position of the object to be detected.

Figures 3A, 3B, 3C:
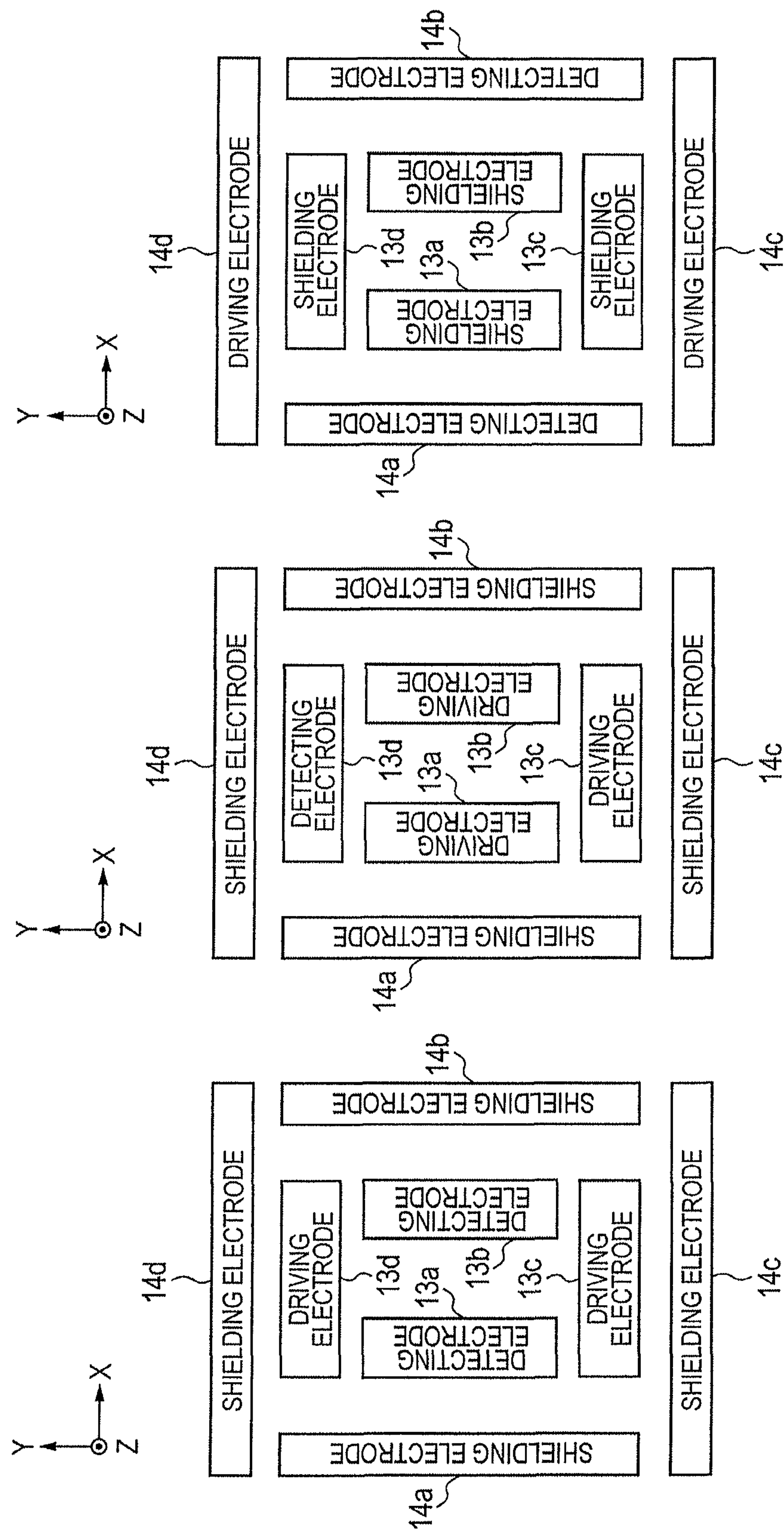
FIGS. 3A to 3C are schematic plan view illustrating a change in the electrodes of the sensor unit in the capacitance-type proximity sensor device according to the embodiment of the invention.

FIG. 3A is a diagram illustrating an example of the electrode pattern of the internal electrodes 13*a* to 13*d* and the external electrodes 14*a* to 14*d* when the internal electrodes 13*a* to 13*d* are used to detect the object to be detected in the X-axis direction. As shown in FIG. 3A, when the object to be detected is detected in the X-axis direction, the internal electrodes 13*a* and 13*b* which are arranged substantially perpendicular to the X-axis direction are used as the detecting electrodes and the internal electrode 13*c* and 13*d* which are arranged substantially in parallel to the X-axis direction are used as the driving electrodes. The external electrodes 14*a* to 14*d* are used as the shielding electrodes. When the object to be detected is detected in the Y-axis direction (vertical direction on the plane of the paper), the internal electrodes 13*c* and 13*d* which are arranged substantially in parallel to the Y-axis direction are used as the detecting electrodes and the internal electrodes 13*a* and 13*b* are used as the driving electrodes. The external electrodes 14*a* to 14*d* are used as the shielding electrodes.

FIG. 3B is a diagram illustrating an example of the electrode pattern of the internal electrodes 13*a* to 13*d* and the external electrodes 14*a* to 14*d* when the internal electrodes 13*a* to 13*d* are used to detect the object to be detected in the Z-axis direction. In the example shown in FIG. 3B, the internal electrodes 13*a* to 13*c* are used as the driving electrodes and the internal electrode 13*d* is used as the detecting electrode. Thus, when the object to be detected is detected in the Z-axis direction, at least one of the internal electrodes 13*a* to 13*d* is used as the detecting electrode, and the other electrodes among the internal electrodes 13*a* to 13*d* are switched to the driving electrodes. The external electrodes 14_a_ to 14_d_ are used as the shielding electrodes.

FIG. 3C is a diagram illustrating an example of the electrode pattern when the external electrodes 14_a_ to 14_d_ are used to detect the object to be detected in the X-axis direction. As shown in FIG. 3C, in this case, a pair of opposite external electrodes 14_a_ and 14_b_ are used as the detecting electrodes and the other pair of opposite external electrode 14_c_ and 14_d_ are used as the driving electrodes. The internal electrodes 13_a_ to 13_d_ are used as the shielding electrodes. When the object to be detected is detected in the Y-axis direction, the external electrodes 14_c_ and 14_d_ are used as the detecting electrodes and the external electrodes 14_a_ and 14_b_ are used as the driving electrodes. Thus, when the external electrodes 14_a_ to 14_d_ are used to detect the object to be detected, it is possible to reduce the influence of external noise from the inside of the sensor unit 11 through using the internal electrodes 13_a_ to 13_d_ as the shielding electrodes.

In this embodiment, when the object to be detected is detected in the Z-axis direction, first, one internal electrode 13_a_ among the four internal electrodes 13_a_ to 13_d_ is used as the detecting electrode and the other internal electrodes 13_b_ to 13_d_ are used as the driving electrodes. Then, the internal electrodes 13_a_ to 13_d_ are sequentially changed to the detecting electrodes and the driving electrodes, thereby measuring the object to be detected. Three internal electrodes 13_b_ to 13_d_ are used as the driving electrodes and a driving voltage is applied to each of the driving electrodes. Then, the intensity of the electric field formed between the electrodes increases and the intensity of the signal output from the detecting electrode increases. Therefore, it is possible to improve detection sensitivity in the Z-axis direction. However, in this embodiment, in the detection of the object to be detected in the Z-axis direction, the number of driving electrodes may be more than the number of detecting electrodes, and the number of electrodes serving as the driving electrodes is not particularly limited.

In this embodiment, when the object to be detected is detected in the Z-axis direction, the object to be detected is measured plural times while the detecting electrode is sequentially changed among the internal electrodes 13_a_ to 13_d_. Then, the average of the measured values of the output signals is calculated and the object to be detected is detected. In this way, it is possible to reduce the directionality of the detection direction in the detection of the object to be detected in the Z-axis direction. For example, when only the internal electrode 13_a_ is used as the detecting electrode to detect the object to be detected, detection sensitivity in the vicinity of the internal electrode 13_a_ is good, but is reduced as the distance from the internal electrode 13_a_ increases. Therefore, measurement is performed plural times while the detecting electrode is sequentially changed among the internal electrodes 13_a_ to 13_d_ and the average value of the output signals is calculated according to the number of measurements. In this way, it is possible to equally detect the object to be detected in four directions in the sensor surface 13 of the sensor unit 11 and thus reduce the directionality of detection sensitivity. In the detection of the object to be detected in the Z-axis direction, similarly to the internal electrodes 13_a_ to 13_d_, the external electrodes 14_a_ to 14_d_ may be changed.

In the examples shown in FIGS. 3A to 3C, the internal electrodes 13_a_ to 13_d_ and the external electrodes 14_a_ to 14_d_ are used to detect the object to be detected. However, the electrode pattern of the detecting electrodes and the driving electrodes is not particularly limited as long as the electrode pattern of the internal electrodes 13_a_ to 13_d_ and the external electrodes 14_a_ to 14_d_ can detect the object position information.

In this embodiment, the internal electrodes 13_a_ to 13_d_ and the external electrodes 14_a_ to 14_d_ of the sensor unit 11 are arranged substantially in parallel to four sides of the sensor surface 13 with a substantially rectangular shape. However, the internal electrodes 13_a_ to 13_d_ and the external electrodes 14_a_ to 14_d_ may be arranged in other shapes, such as a diamond shape or a lattice shape.

The internal electrodes 13_a_ to 13_d_ and the external electrodes 14_a_ to 14_d_ may be arranged in the range in which the detection reference plane can be formed by the capacitance between the electrodes, but are not necessarily arranged in the same plane. For example, the internal electrodes 13_a_ to 13_d_ and the external electrodes 14_a_ to 14_d_ may be arranged on the sensor surface 13 in the Z-axis direction.

Figure 4:
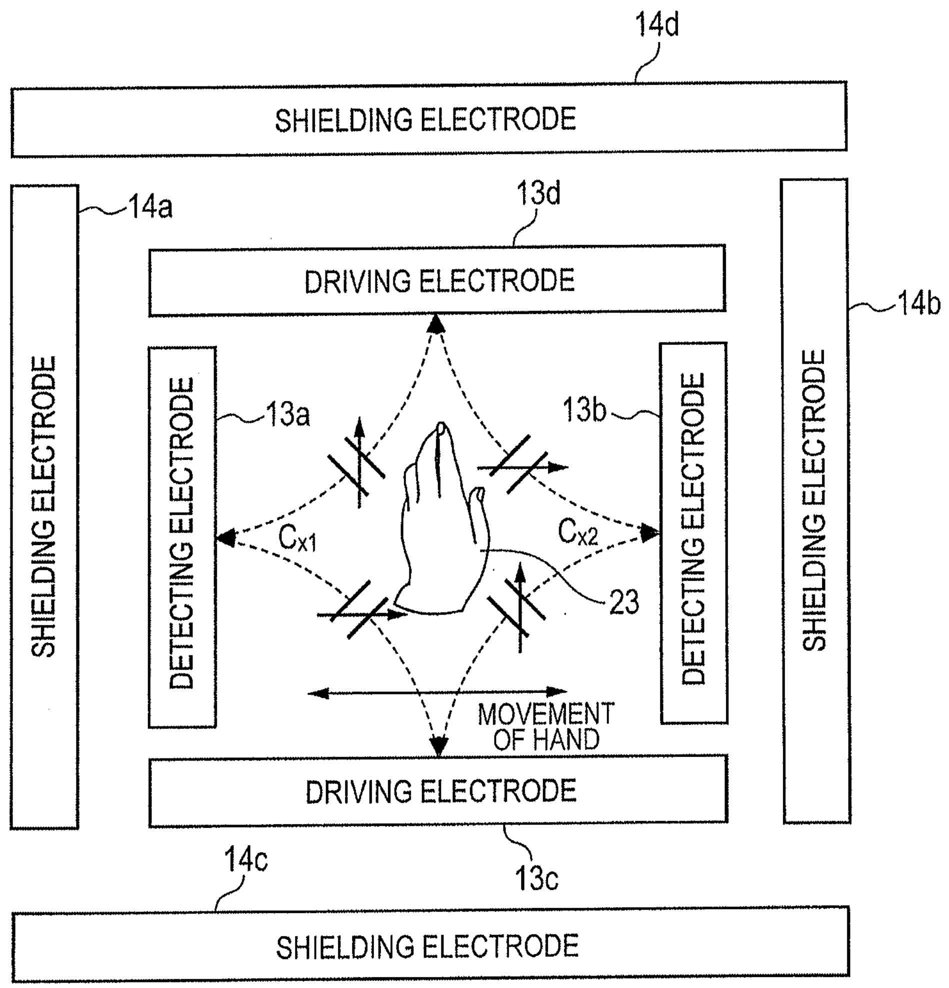
FIG. 4 is a diagram illustrating the principle of detecting an object to be detected in the X-axis direction and the Y-axis direction in the capacitance-type proximity sensor device according to the embodiment of the invention.

Next, the principle of detecting the object to be detected in the X-axis direction and the Y-axis direction in the capacitance-type proximity sensor device according to this embodiment will be described with reference to FIG. 4. As shown in FIG. 4, when the object to be detected is detected in the X-axis direction, a pair of internal electrodes 13_a_ and 13_b_ which are opposite to each other in the X-axis direction are used as the detecting electrodes and the other pair of internal electrodes 13_c_ and 13_d_ which are opposite to each other in the Y-axis direction are used as the driving electrodes. In this case, a capacitance $C_{x1}$ is formed between the internal electrode 13_a_ and the internal electrodes 13_c_ and 13_d_ and a capacitance $C_{x2}$ is formed between the internal electrode 13_b_ and the internal electrodes 13_c_ and 13_d_. Then, the difference between the output signals from the detecting electrodes corresponding to the capacitances $C_{x1}$ and $C_{x2}$ is calculated. In this way, it is possible to detect the position of the hand, which is an object 23 to be detected. FIG. 4 also shows a case in which the position of the object 23 to be detected is detected when the object 23 to be detected moves in the X-axis direction.

Figure 5:
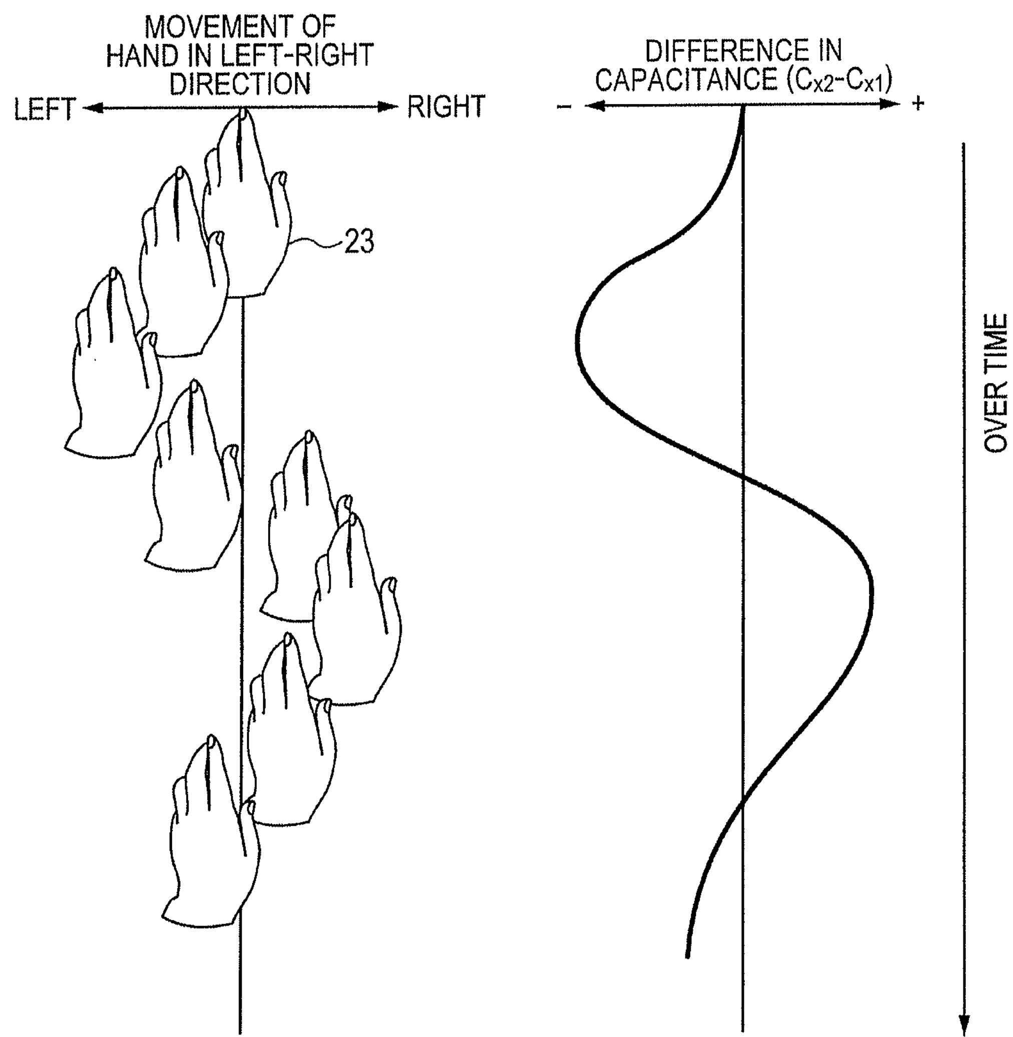
FIG. 5 is a diagram illustrating the motion of the object to be detected and a capacitance variation in the capacitance-type proximity sensor device according to the embodiment of the invention.

In addition, the motion of the object 23 to be detected and a capacitance variation will be described with reference to FIGS. 4 and 5. FIG. 5 is a diagram illustrating a variation in the difference between the capacitances when the object 23 to be detected moves in the left-right direction in the example shown in FIG. 4. As shown in FIG. 5, when the object 23 to be detected moves to one side in the X-axis direction (left-right direction), electric field lines (not shown) formed between the internal electrodes 13_a_ to 13_d_ are absorbed to the object 23 to be detected and the capacitances $C_{x1}$ and $C_{x2}$ vary. For example, when the object 23 to be detected moves to the right side, the capacitance $C_{x1}$ increases and the capacitance $C_{x2}$ decreases. Therefore, when the object 23 to be detected moves in the X-axis direction (left-right direction), the difference ($C_{x2}-C_{x1}$) between the capacitance values is calculated and it is possible to detect the position information and movement (motion) of the object 23 to be detected in the X-axis direction (left-right direction) from the capacitance variation, as shown in FIG. 4. When the object 23 to be detected is detected in the Y-axis direction, the internal electrodes 13_c_ and 13_d_ of the sensor unit 11 are used as the detecting electrodes and the internal electrodes 13_a_ and 13_b_ thereof are used as the driving electrodes. In this way, it is possible to detect the object to be detected with the same principle as that in the X-axis direction.

Figure 6A:
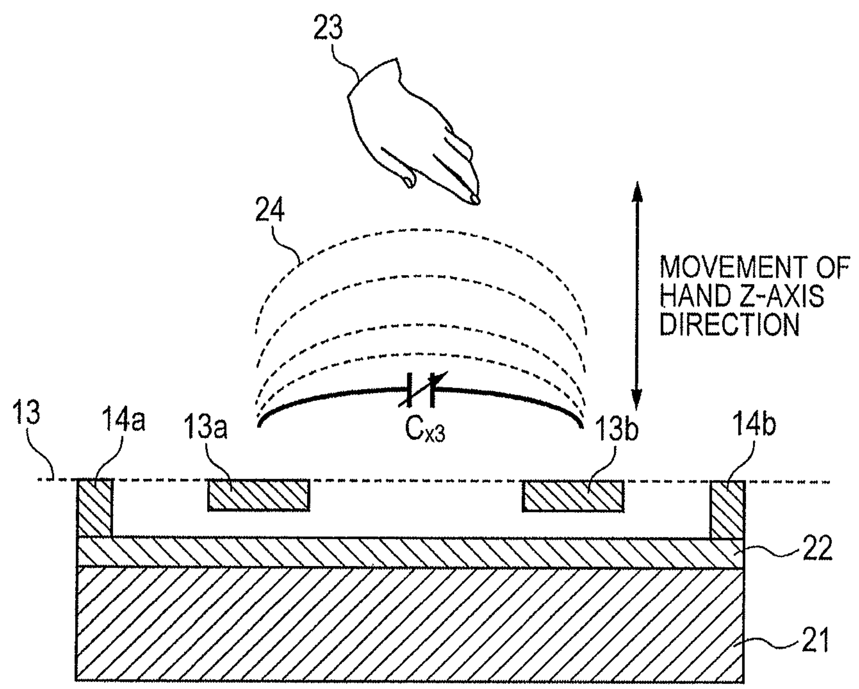
FIGS. 6A and 6B are diagrams illustrating the principle of detecting an object to be detected in the Z-axis direction in the capacitance-type proximity sensor device according to the embodiment of the invention.
Figure 6B:
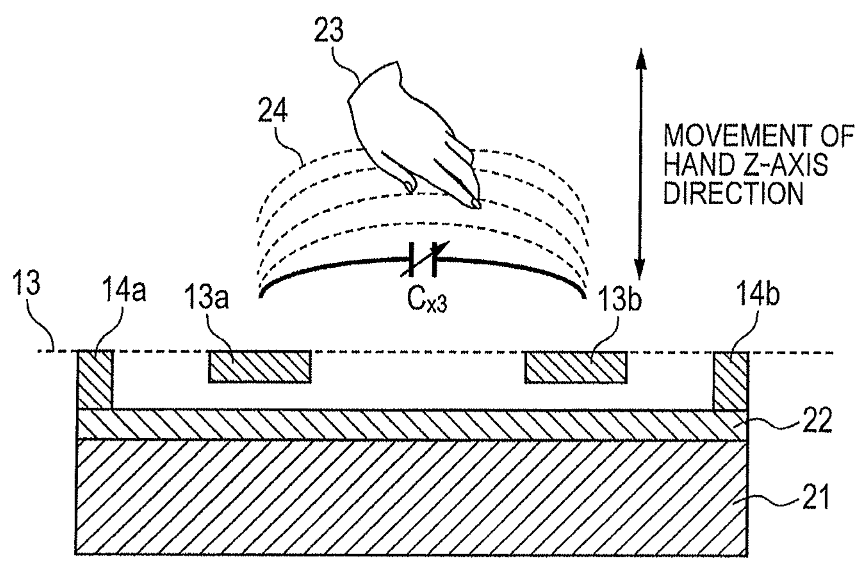

Next, the principle of detecting the object to be detected in the Z-axis direction by the capacitance-type proximity sensor device according to this embodiment will be described with reference to FIGS. 6A and 6B. FIGS. 6A and 6B are cross-sectional views illustrating the sensor unit 11 taken along the line A-A of FIG. 2A. As shown in FIGS. 6A and 6B, in this state, a capacitance $C_{X3}$ is formed between the internal electrode 13*a* and the internal electrode 13*b* (the capacitance is also formed between the internal electrodes 13*c* and 13*d*) and electric field lines 24 are formed around the capacitance $C_{X3}$.

As shown in FIG. 6A, when the distance between the sensor surface 13 and the object 23 to be detected in the Z-axis direction is long, only some of the electric field lines 24 are absorbed by the object 23 to be detected and the capacitance $C_{X3}$ is large. On the other hand, as shown in FIG. 6B, when the distance between the sensor surface 13 and the object 23 to be detected is short, most of the electric field lines 24 are absorbed by the object 23 to be detected and the capacitance $C_{X3}$ is small. Thus, in this embodiment, when the distance between the sensor surface 13 and the object 23 to be detected is short, the capacitance $C_{X3}$ is reduced and the intensity of the output signal from the internal electrode 13*a* serving as the detecting electrode increases. When the distance between the sensor surface 13 and the object to be detected is long, the capacitance $C_{X3}$ increases and the intensity of the output signal from the internal electrode 13*a* serving as the detecting electrode decreases. In this way, in this embodiment, the distance between the sensor surface 13 and the object 23 to be detected in the Z-axis direction is detected.

In the examples shown in FIGS. 4 to 6B, a variation in the capacitances $C_{x1}$ to $C_{x3}$ formed between the internal electrodes 13*a* to 13*d* has been described. However, similarly, capacitances $C_{x4}$ to $C_{x6}$ are formed between the external electrodes 14*a* to 14*d* (not shown) and it is possible to detect the object to be detected using the external electrodes 14*a* to 14*d*.

Next, a process of calculating the position of the object to be detected will be described. In this embodiment, a combination of a first detection pattern in which the internal electrodes 13*a* to 13*d* are mainly used to detect a first object position information item and a second detection pattern in which the external electrodes 14*a* to 14*d* are mainly used to detect a second object position information item is used to detect the position of the object to be detected. In the first detection pattern and the second detection pattern, a plurality of electrode patterns are changed depending on the direction of a detection target, thereby detecting the object to be detected.

Figure 7:
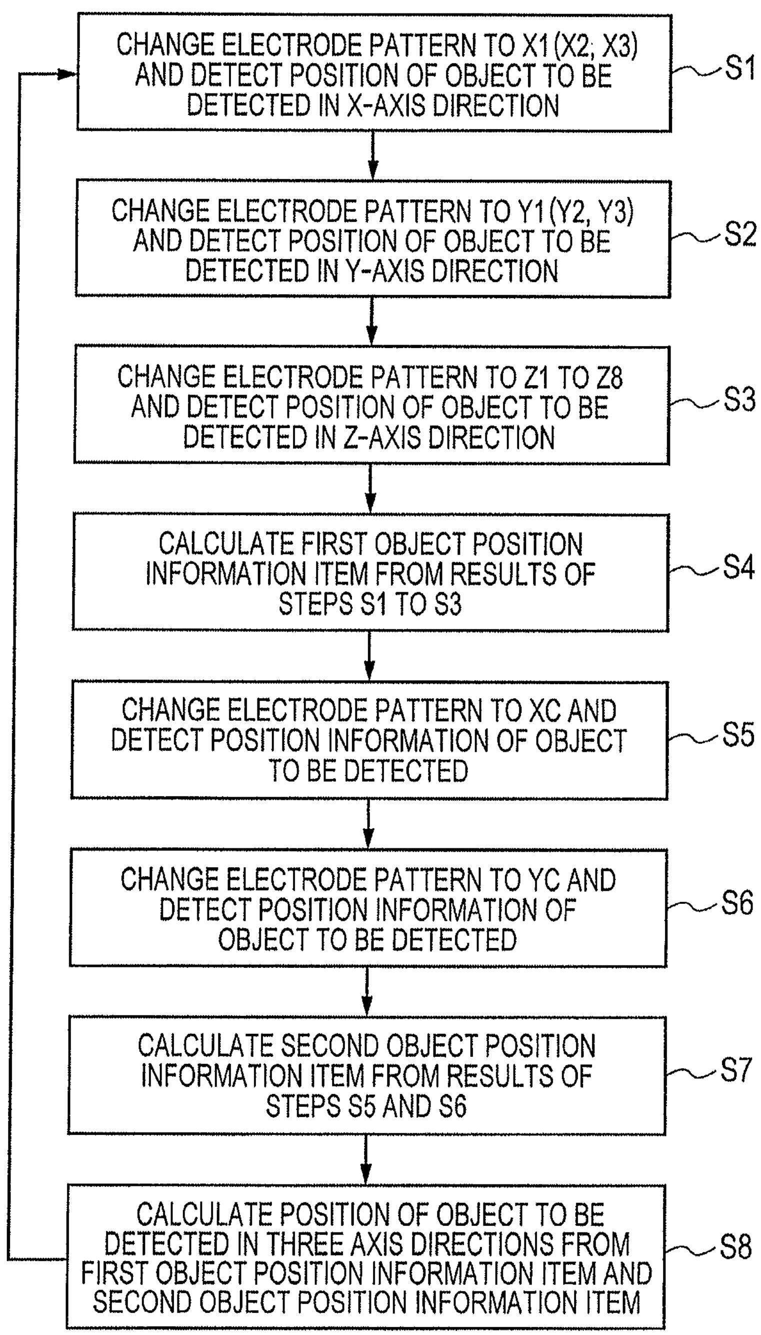
FIG. 7 is a flowchart illustrating an example of the electrode pattern change control of the capacitance-type proximity sensor device according to this embodiment.

Next, the process of calculating the position of the object to be detected will be described in detail with reference to FIG. 7 and Table 1. FIG. 7 is a flowchart illustrating an example of the electrode pattern change control of the capacitance-type proximity sensor device according to this embodiment. The electrode patterns used in Steps S1 to S7 of FIG. 7 are shown in Table 1.

TABLE 1

| Electrode | Internal electrode | | | | External electrode | | | |
|---|---|---|---|---|---|---|---|---|
| pattern | 13a | 13b | 13c | 13d | 14a | 14b | 14c | 14d |
| X1 | S− | S+ | D | D | G | G | G | G |
| Y1 | D | D | S− | S+ | G | G | G | G |
| Z1 | S+ | D | D | D | G | G | G | G |
| Z2 | D | S+ | D | D | G | G | G | G |
| Z3 | D | D | S+ | D | G | G | G | G |
| Z4 | D | D | D | S+ | G | G | G | G |
| XC | G | G | G | G | S− | S+ | D | D |
| YC | G | G | G | G | D | D | S− | S+ |

D: driving electrode
S+: detecting electrode (amplifying circuit 19 + terminal input)
S−: detecting electrode (amplifying circuit 19 − terminal input)
G: shielding electrode First, the first object position information item is calculated using the first detection pattern in which the internal electrodes 13*a* to 13*d* are mainly used. As shown in FIG. 7 and Table 1, when object position information in the X-axis direction is detected, the internal electrodes 13*a* and 13*b* are used as the detecting electrodes and the internal electrodes 13*c* and 13*d* are used as the driving electrodes. The external electrodes 14*a* to 14*d* are used as the shielding electrodes and are connected to the ground (Table 1: electrode pattern X1). Then, the driving voltage is applied to the internal electrodes 13*c* and 13*d* serving as the driving electrodes. Then, the object position information in the X-axis direction is detected on the basis of the difference value between the signals output from the internal electrodes 13*a* and 13*b* serving as the detecting electrodes (FIG. 7: Step S1).

When object position information in the Y-axis direction is detected, the internal electrodes 13*c* and 13*d* are used as the detecting electrodes and the internal electrodes 13*a* and 13*b* are used as the driving electrodes (Table 1: an electrode pattern Y1). Then, the driving voltage is applied to the internal electrodes 13*a* and 13*b* serving as the driving electrodes. Then, the object position information in the Y-axis direction is detected on the basis of the difference value between the signals output from the internal electrodes 13*c* and 13*d* serving as the detecting electrodes (FIG. 7: Step S2).

Then, object position information in the Z-axis direction is detected. First, the internal electrode 13*a* is used as the detecting electrode and the other internal electrodes 13*b* to 13*d* are used as the driving electrodes (Table 1: an electrode pattern Z1). Then, the driving voltage is applied to three internal electrodes 13*b* to 13*d* serving as the driving electrodes and a signal is output from the internal electrode 13*a* serving as the detecting electrode. Then, the internal electrode 13*b* is used as the detecting electrode and the other internal electrodes 13*a*, 13*c*, and 13*d* are used as the driving electrodes (Table 1: an electrode pattern Z2). Then, the driving voltage is applied to the three internal electrodes 13*a*, 13*c*, and 13*d* serving as the driving electrodes and a signal is output from the internal electrode 13*b* serving as the detecting electrode.

Then, the internal electrode 13*c* is used as the detecting electrode and the other internal electrodes 13*a*, 13*b*, and 13*d* are used as the detecting electrodes (Table 1: an electrode pattern Z3). Then, the driving voltage is applied to the three internal electrodes 13*a*, 13*b*, and 13*d* serving as the driving electrodes and a signal is output from the internal electrode 13*c* serving as the detecting electrode. Then, the internal electrode 13*d* is used as the detecting electrode and the other internal electrodes 13*a* to 13*c* are used as the driving electrodes (Table 1: an electrode pattern Z4). Then, the driving voltage is applied to the internal electrodes 13*a* to 13*c* serving as the driving electrodes and a signal is output from the internal electrode 13*d* serving as the detecting electrode. Then, the average of the signals output from the internal electrodes 13*a* to 13*d* serving as the detecting electrodes is calculated and the object position information in the Z-axis direction is detected (FIG. 7: Step S3). Then, the first object position information item is calculated from the obtained object position information items in the X-axis direction, the Y-axis direction, and the Z-axis direction (FIG. 7: Step S4).

Next, the second object position information item is detected using the second detection pattern in which the external electrodes 14*a* to 14*d* are mainly used. When object position information in the X-axis direction is detected, the external electrodes 14*a* and 14*b* are used as the detecting electrodes and the external electrodes 14*c* and 14*d* are used as the driving electrodes. The internal electrodes 13*a* to 13*d* are used as the shielding electrodes and are connected to the ground (Table 1: an electrode pattern XC). Then, the driving voltage is applied to the external electrodes 14*c* and 14*d* serving as the driving electrodes. Then, the object position information in the X-axis direction is detected on the basis of the difference value between the signals output from the external electrodes 14*a* and 14*b* serving as the detecting electrodes (FIG. 7: Step S5).

When object position information in the Y-axis direction is detected, the external electrodes 14*c* and 14*d* are used as the detecting electrodes and the external electrodes 14*a* and 14*b* are used as the driving electrodes (Table 1: an electrode pattern YC). Then, the driving voltage is applied to the external electrodes 14*a* and 14*b* serving as the driving electrodes. Then, the difference value between the signals output from the external electrodes 14*c* and 14*d* serving as the detecting electrodes is detected (FIG. 7: Step S6). Then, the second object position information item is calculated from the obtained object position information in the X-axis direction and the obtained object position information in the Y-axis direction (FIG. 7: Step S7).

Finally, the first object position information item and the second object position information item are used to calculate the position of the object to be detected in three axis directions (FIG. 7: Step S8). In this way, since the first object position information item and the second object position information item are used to calculate the position of the object to be detected in three axis directions, it is possible to detect the position of the object to be detected and the contact state between the object to be detected and the sensor unit 11 with high accuracy. In addition, if necessary, the object position information may be detected plural times using the internal electrodes 13*a* to 13*d* and the external electrodes 14*a* to 14*d* and the average of the output signals from the electrodes may be calculated.

In the calculation of the position of the object to be detected using the first object position information item and the second object position information item, the first object position information item is corrected using the second object position information item. Therefore, it is possible to calculate the position of the object to be detected with high accuracy. The correction of the first object position information item with the second object position information item can be performed by calculating, for example, the difference between the position of the object to be detected which is calculated on the basis of the first object position information item and the position of the object to be detected which is calculated on the second object position information item. In addition, the first object position information item may be used to calculate the position of the object to be detected and the second object position information item may be used to detect the size of the object to be detected or the contact state with the proximity sensor. In particular, in this embodiment, the first object position information item is obtained through the external electrodes 14*a* to 14*d* which serve as the shielding electrodes and are connected to the ground, but the second object position information item is detected without being through the shielding electrodes. Therefore, it is possible to detect a very small capacitance variation. Thus, the position of the object to be detected is calculated using two kinds of object position information which are detected in different surrounding environments. Therefore, it is possible to detect the position of the object to be detected in three axis directions with high sensitivity and high accuracy and detect a very small variation in the approach state of the object to be detected.

Next, the operation of the capacitance-type proximity sensor device having the above-mentioned structure according to this embodiment will be described with reference to FIG. 1. First, the multiplexer 15 changes the internal electrodes 13*a* to 13*d* and the external electrode 14*a* to 14*d* to the driving electrodes, the detecting electrodes, and the shielding electrodes according to the detection direction. Then, the driving voltage whose timing is controlled by the CPU 16 is applied to the internal electrodes 13*a* to 13*d* and the external electrodes 14*a* to 14*d* which are changed to the driving electrodes by the driving circuit 17. When an object to be detected is in a detection region of the proximity sensor, the capacitances $C_{X1}$ to $C_{X6}$ formed between the electrodes are changed. Therefore, signals corresponding to the capacitances $C_{X1}$ to $C_{X6}$ are output from the detecting electrodes.

The signals output from the internal electrodes 13*a* to 13*d* and the external electrodes 14*a* to 14*d* serving as the detecting electrodes are input to the amplifying circuit 19 of the detecting circuit 18 and are then amplified. The A/D converter 20 filters the amplified output signals, converts the filtered output signals into digital output signals, and outputs the digital output signals to the CPU 16. The CPU 16 corrects the object position information detected by the internal electrodes 13*a* to 13*d* using the object position information detected by the external electrodes 14*a* to 14*d* on the basis of the input output signals, and calculates object position information. In this way, the proximity sensor device according to this embodiment detects the position of the object to be detected, on the basis of the capacitances $C_{X1}$ to $C_{X6}$ of the sensor unit 11 generated by the approach of the object to be detected.

Figure 8A:
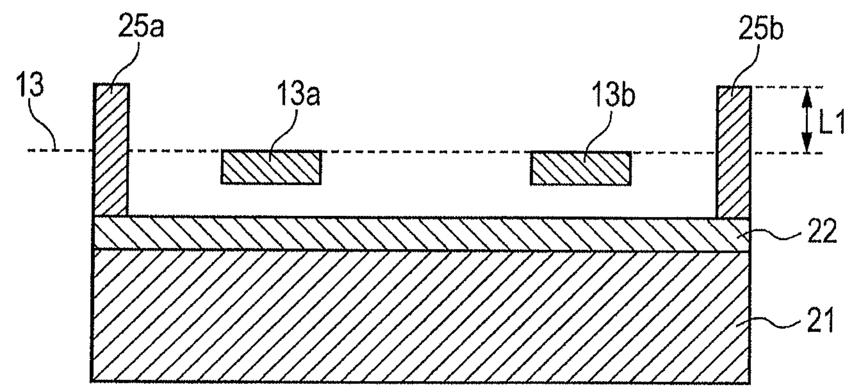
FIGS. 8A and 8B are diagrams illustrating an example of the shape of the external electrode in the capacitance-type proximity sensor device according to the embodiment of the invention.
Figure 8B:
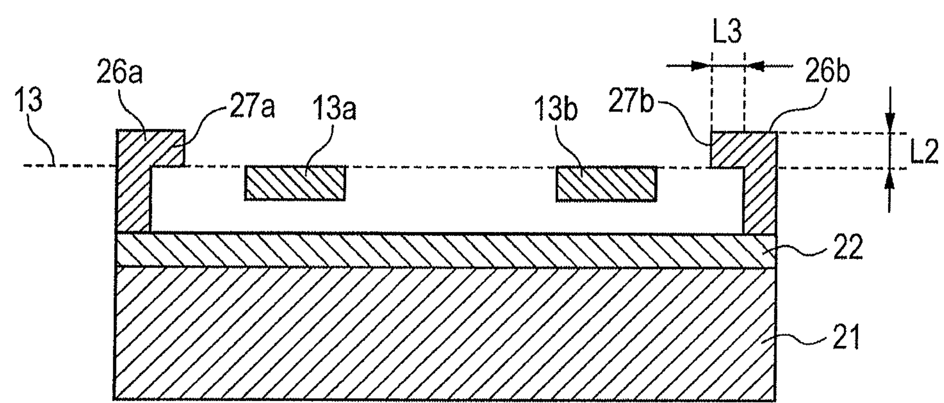

The external electrodes may have shapes different from that shown in FIGS. 2A and 2B. FIGS. 8A and 8B are diagrams illustrating an example of the shape of the external electrode. Similarly to FIG. 2B, FIGS. 8A and 8B are cross-sectional views taken along the line A-A of FIG. 2A.

In the example shown in FIG. 8A, the upper surfaces of external electrodes 25*a* and 25*b* protrude from the internal electrodes 13*a* and 13*b*. The external electrodes 25*a* and 25*b* extend such that the upper surfaces are higher than the sensor surface 13 including the upper surfaces of the internal electrodes 13*a* and 13*b* by a predetermined length L1. When the external electrodes 25*a* and 25*b* having the above-mentioned shape are used, it is possible to shield external noise in the direction of the XY-plane with respect to the internal electrodes 13*a* to 13*d* serving as the detecting electrodes at a height corresponding to the predetermined length L1 from the sensor surface 13. Therefore, it is possible to reduce the influence of external noise. The shape of the external electrodes 25*a* and 25*b* is not particularly limited as long as it can reduce the influence of external noise on the internal electrodes 13*a* and 13*b*.

In the example shown in FIG. 8B, external electrodes 26*a* and 26*b* have an L-shape in a cross-sectional view. The external electrodes 26*a* and 26*b* extend in the height direction so as to be higher than the internal electrodes 13*a* and 13*b* by a predetermined length L2. In addition, the upper parts of the external electrodes 26*a* and 26*b* are bent so as to face each other and the external electrodes 26*a* and 26*b* include extension portions 27*a* and 27*b* which extend in the opposite direction and have a predetermined length L3. Thus, when the external electrodes 26*a* and 26*b* including the extension portions 27*a* and 27*b* are used, it is possible to shield external noise from the upper side of the internal electrodes 13*a* and 13*b* and thus reduce the influence of external noise. The predetermined length L3 shown in FIGS. 8A and 8B may be arbitrarily adjusted according to external noise to be shielded.

In this embodiment, in the first detection pattern and the second detection pattern, electrode pattern change control different from that shown in FIG. 7 and Table 1 may be performed. Next, an another example of the electrode pattern will be described with reference to FIG. 7, the following Table 2, and the following Table 3 and the description is focused on the difference from Table 1.

TABLE 2

| Electrode | Internal electrode | | | | External electrode | | | |
|---|---|---|---|---|---|---|---|---|
| pattern | 13a | 13b | 13c | 13d | 14a | 14b | 14c | 14d |
| X2 | S− | G | D | D | G | S+ | G | G |
| X3 | G | S+ | D | D | S− | G | G | G |
| Y2 | D | D | S− | G | G | G | G | S+ |
| Y3 | D | D | G | S+ | G | G | S− | G |
| Z1 | S+ | D | D | D | G | G | G | G |
| Z2 | D | S+ | D | D | G | G | G | G |
| Z3 | D | D | S+ | D | G | G | G | G |
| Z4 | D | D | D | S+ | G | G | G | G |
| XC | G | G | G | G | S− | S+ | D | D |
| YC | G | G | G | G | D | D | S− | S+ |

D: driving electrode
S+: detecting electrode (amplifying circuit 19 + terminal input)
S−: detecting electrode (amplifying circuit 19 − terminal input)
G: shielding electrode Table 2 shows an example in which the electrode pattern in Steps S1 and S2 of FIG. 7 is changed. In this example, in Steps S1 and S2 of FIG. 7, the internal electrodes and the external electrodes form two different pairs in the X-axis direction and the Y-axis direction and the two pairs of the internal electrodes and the external electrodes are used to measure the object to be detected. The other portions are the same as those in Table 1 and thus the description thereof will not be repeated.

When object position information in the X-axis direction is detected, a pair of the internal electrode 13*a* and the external electrode 14*b* are used as the detecting electrodes and the internal electrodes 13*c* and 13*d* are used as the driving electrode. The internal electrode 13*b* and the external electrodes 14*a*, 14*c*, and 14*d* are used as the shielding electrodes and are connected to the ground (Table 2: an electrode pattern X2). Then, a pair of the internal electrode 13*b* and the external electrode 14*a* are used as the detecting electrodes and the internal electrodes 13*c* and 13*d* are used as the driving electrodes. The internal electrode 13*a* and the external electrodes 14*b* to 14*d* are used as the shielding electrodes and are connected to the ground (Table 2: an electrode pattern X3). In this way, the object position information in the X-axis direction is detected two times (FIG. 7: Step S1).

When object position information in the Y-axis direction is detected, a pair of the internal electrode 13*c* and the external electrode 14*d* are used as the detecting electrodes and the internal electrodes 13*a* and 13*b* are used as the driving electrode. The internal electrode 13*d* and the external electrodes 14*a* to 14*c* are used as the shielding electrodes and are connected to the ground (Table 2: an electrode pattern Y2). Then, a pair of the internal electrode 13*d* and the external electrode 14*c* are used as the detecting electrodes and the internal electrodes 13*a* and 13*b* are used as the driving electrodes. The internal electrode 13*c* and the external electrodes 14*a*, 14*b*, and 14*d* are used as the shielding electrodes and are connected to the ground (Table 2: an electrode pattern Y3). In this way, the object position information in the Y-axis direction is detected two times (FIG. 7: Step S2).

In this way, among the internal electrodes 13*a* to 13*d* and the external electrodes 14*a* to 14*d*, two different pairs of internal and external electrodes are used as the detecting electrodes to measure the object to be detected two times in the X-axis direction and the Y-axis direction, and the average value of the signals output from the electrodes is calculated, thereby measuring the object to be detected (FIG. 7: Step S4). The other processes are the same as those shown in FIG. 7 and Table 1 and thus the description thereof will not be repeated.

Figure 9:
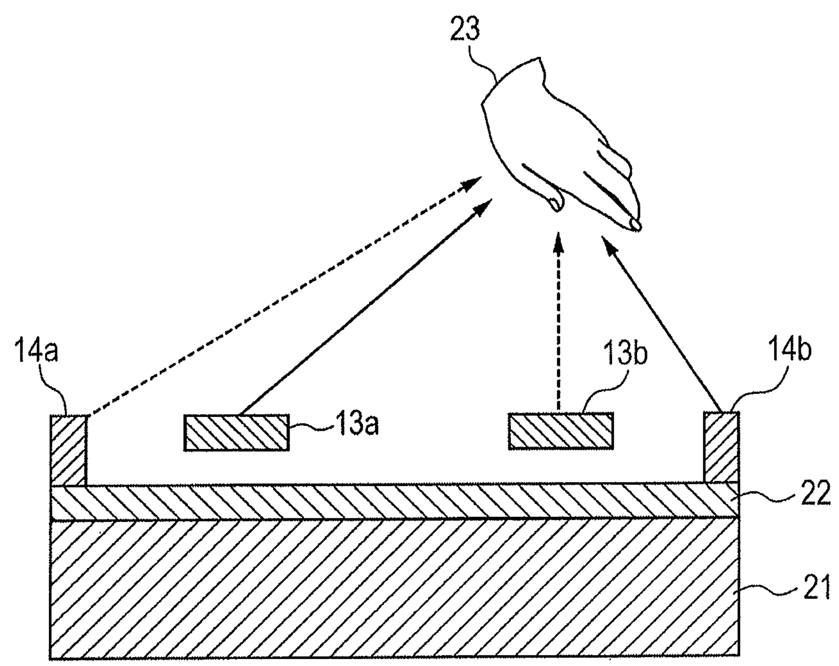
FIG. 9 is a diagram illustrating the relative positional relationship between the object to be detected and the internal and external electrodes of the sensor unit in the capacitance-type proximity sensor device according to the embodiment of the invention.

In the electrode pattern shown in Table 2, among the internal electrodes 13*a* to 13*d* and the external electrodes 14*a* to 14*d*, two different pairs of internal and external electrodes are used in the X-axis direction and the Y-axis direction. Therefore, it is easy to detect the size of the object to be detected in addition to the position of the object to be detected. FIG. 9 is a diagram schematically illustrating the relative positional relationship between the object 23 to be detected, and the internal electrodes 13*a* to 13*d* and the external electrodes 14*a* to 14*d* of the sensor unit 11. As shown in FIG. 9, in the electrode pattern shown in Table 2, a combination of the internal electrode 13*a* and the external electrode 14*b* (Table 2: an electrode pattern X1) and a combination of the internal electrode 13*b* and the external electrode 14*a* (Table 2: an electrode pattern X2) are used to detect the object to be detected in the X-axis direction. In this case, the distance of the object 23 to be detected from the combination of the internal electrode 13*a* and the external electrode 14*b* (Table 2: the electrode pattern X1) which is represented by a solid arrow in FIG. 9 is shorter than the distance of the object 23 to be detected from the combination of the internal electrode 13*b* and the external electrode 14*a* (Table 2: the electrode pattern X2) which is represented by a dotted arrow in FIG. 9. In this way, the object position information is detected from two points with different distances using two different pairs of internal and external electrodes. Therefore, a calculation process using, for example, trigonometry can be performed for each object position information item to obtain information about the size of the object 23 to be detected in addition to the distance between the object to be detected and the sensor unit.

TABLE 3

| Electrode | Internal electrode | | | | External electrode | | | |
|---|---|---|---|---|---|---|---|---|
| pattern | 13a | 13b | 13c | 13d | 14a | 14b | 14c | 14d |
| X4 | S− | S+ | D | D | S− | S+ | D | D |
| Y4 | D | D | S− | S+ | D | D | S− | S+ |
| Z5 | S+ | D | D | D | S+ | D | D | D |
| Z6 | D | S+ | D | D | D | S+ | D | D |
| Z7 | D | D | S+ | D | D | D | S+ | D |
| Z8 | D | D | D | S+ | D | D | D | S+ |
| XC | G | G | G | G | S− | S+ | D | D |
| YC | G | G | G | G | D | D | S− | S+ |

D: driving electrode
S+: detecting electrode (amplifying circuit 19 + terminal input)
S−: detecting electrode (amplifying circuit 19 − terminal input)
G: shielding electrode Table 3 shows another example in which the electrode pattern is changed in Steps S1 to S3 of FIG. 7. In this example, in Steps S1 to S3 of FIG. 7, when the first object position information item is detected, the internal electrodes and the external electrodes which are arranged opposite to each other are used as the detecting electrodes or the driving electrodes and no shielding electrode is used, thereby detecting the object to be detected. The other portions are the same as those in the examples shown in Table 1 and Table 2 and thus the description thereof will not be repeated.

When object position information in the X-axis direction is detected, the internal electrodes 13*a* and 13*b* and the external electrodes 14*a* and 14*b* are used as the detecting electrodes, and the internal electrodes 13*c* and 13*d* and the external electrodes 14*c* and 14*d* are used as the driving electrodes (Table 3: an electrode pattern X4). In this way, the object position information in the X-axis direction is detected (FIG. 7: Step S1).

When object position information in the Y-axis direction is detected, the internal electrodes 13*c* and 13*d* and the external electrodes 14*c* and 14*d* are used as the detecting electrodes and the internal electrodes 13*a* and 13*b* and the external electrodes 14*a* and 14*b* are used as the driving electrodes (Table 3: an electrode pattern Y4). In this way, the object position information in the Y-axis direction is detected (FIG. 7: Step S2).

When object position information in the Z-axis direction is detected, the internal electrode 13*a* and the external electrode 14*a* are used as the detecting electrodes and the internal electrodes 13*b* to 13*d* and the external electrodes 14*b* to 14*d* are used as the driving electrodes (Table 3: an electrode pattern Z5). Then, the internal electrode 13*b* and the external electrode 14*b* are used as the detecting electrodes, and the internal electrodes 13*a*, 13*c*, and 13*d* and the external electrodes 14*a*, 14*c*, and 14*d* are used as the driving electrodes (Table 3: an electrode pattern Z6). Then, the internal electrode 13*c* and the external electrode 14*c* are used as the detecting electrodes, and the internal electrodes 13*a*, 13*b*, and 13*d* and the external electrodes 14*a*, 14*b*, and 14*d* are used as the driving electrodes (Table 3: an electrode pattern Z7). Then, the internal electrode 13*d* and the external electrode 14*d* are used as the detecting electrodes, and the internal electrodes 13*a* to 13*c* and the external electrodes 14*a* to 14*c* are used as the driving electrodes (Table 3: an electrode pattern Z8). The output signals from the internal electrodes 13*a* to 13*d* and the external electrode 14*a* to 14*d* which are obtained in this way are averaged and the object position information in the Z-axis direction is calculated (FIG. 7: Step S3). The other processes are the same as those in FIG. 7 and Table 1 and thus the description thereof will not be repeated.

Thus, in this example, when the first object position information item is detected, no shielding electrode is used and the internal electrodes 13*a* to 13*d* and the external electrodes 14*a* to 14*d* are used as the detecting electrodes or the driving electrodes. At that time, among the external electrodes 14*a* to 14*d*, the corresponding external electrodes which are arranged in the outer circumference of the internal electrodes serving as the detecting electrodes among the internal electrodes 13*a* to 13*d* are used as the detecting electrodes, and the other internal and external electrodes among the internal electrodes 13*a* to 13*d* and the external electrodes 14*a* to 14*d* are used as the driving electrodes. Therefore, the number of electric field lines formed on the sensor surface 13 increases and thus electric field intensity increases. As a result, the intensity of the signal output from the detecting electrode increases and it is possible to increase detection sensitivity.

In the above-mentioned example, the external electrodes 14*a* to 14*d* are arranged in all directions with respect to the internal electrodes 13*a* to 13*d*. However, the external electrodes 14*a* to 14*d* may be arranged in the necessary direction according to the influence of external noise.

The capacitance-type proximity sensor device according to this embodiment can shield external noise, have high detection sensitivity, and detect information about, for example, the size of the object to be detected. Therefore, in particular, the capacitance-type proximity sensor device can be suitably used in an electronic apparatus, such as a portable apparatus. Next, the output signal when the proximity sensor device according to this embodiment is used in a portable apparatus will be described with reference to FIGS. 10A to 10C.

Figure 10A:
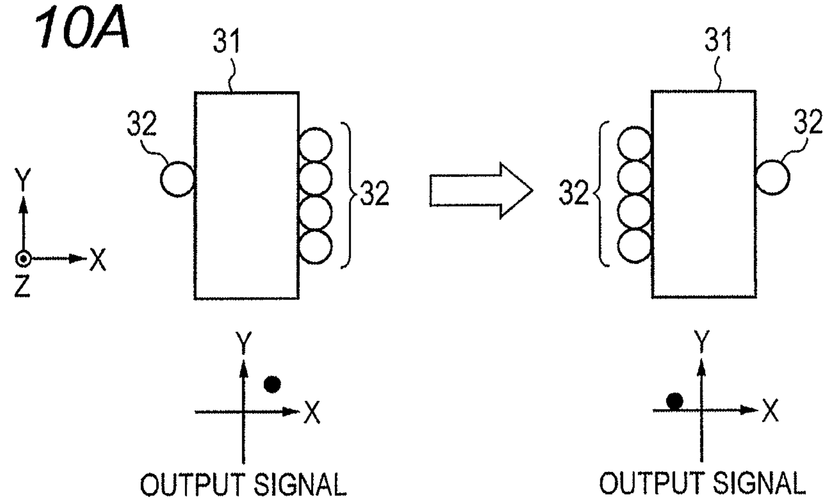
FIGS. 10A to 10C are plan views schematically illustrating the holding state of a portable apparatus including the capacitance-type proximity sensor device according to the embodiment of the invention.
Figure 10B:
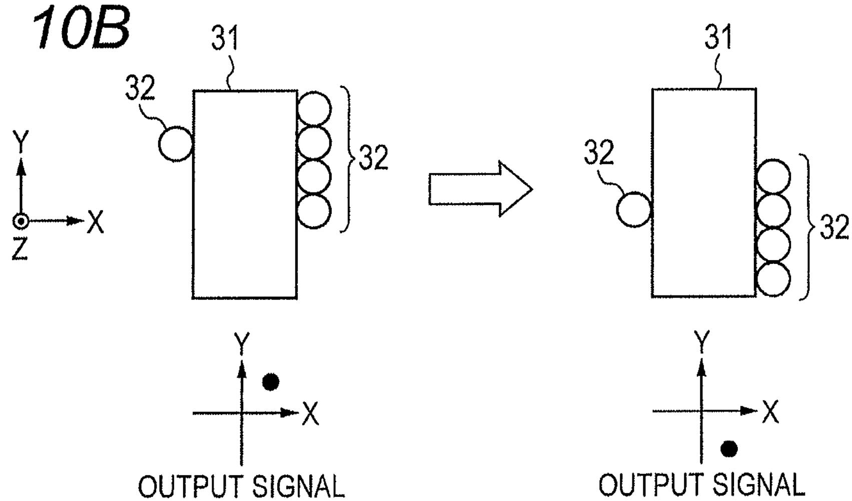
Figure 10C:
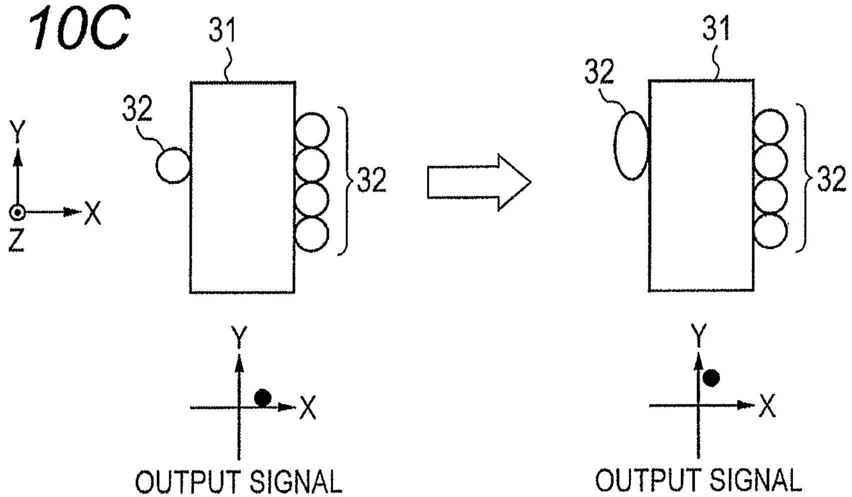

FIGS. 10A to 10C are plan views schematically illustrating a portable apparatus 31 including the proximity sensor device according to this embodiment. FIGS. 10A to 10C are plan views schematically states in which the portable apparatus 31 including the proximity sensor device is held by the hand from the rear side of the plane of paper and show the intensity of the output signal from the detecting electrode related to the second object position information item in the X-axis direction and the Y-axis direction in each state.

FIG. 10A shows a change in the output signal when the portable apparatus 31 is held by the left hand and when the portable apparatus 31 is held by the right hand. As shown in FIG. 10A, when the portable apparatus 31 is held by the left hand, the left side of the portable apparatus 31 is held by one finger 32 and the right side thereof is held by four fingers 32 in a plan view. In this case, the contact area between the right side of the portable apparatus 31 and the fingers, which are objects to be detected, is relatively large. Therefore, the intensity of the output signal from the detecting electrode increases to the positive side in the X-axis direction.

On the other hand, when the portable apparatus 31 is held by the right hand, the right side of the portable apparatus 31 is held by the one finger 32 and the left side thereof is held by the four fingers 32 in a plan view. In this state, the contact area between the left side of the portable apparatus 31 and the fingers 32, which are an object to be detected, is relatively large. Therefore, the intensity of the output signal from the detecting electrode increases to the negative side in the X-axis direction. Thus, the portable apparatus 31 including the capacitance-type proximity sensor device according to this embodiment can detect a change in the position of the finger 32.

FIG. 10B is a diagram illustrating a change in the output signals from the external electrodes 14*a* to 14*d* when the portable apparatus 31 is held by the left hand and the holding position is changed. As shown in FIG. 10B, when the upper side of the portable apparatus 31 is held, the intensity of the output signal from the detecting electrode increases to the positive side in the Y-axis direction. On the other hand, when the lower side of the portable apparatus 31 is held, the intensity of the output signal from the detecting electrode increases to the negative side in the Y-axis direction. As such, the portable apparatus 31 including the proximity sensor device according to this embodiment can detect a change in the holding position of the portable apparatus 31.

FIG. 10C is a diagram illustrating a change in the output signal from the detecting electrode when the holding state of the portable apparatus 31 is changed. As shown in FIG. 10C, when the portable apparatus 31 is held by the left hand and the contact area between the portable apparatus 31 and the finger 32 holding the left side of the portable apparatus increases toward the upper surface of the portable apparatus 31, the output signal from the detecting electrode increases to the negative side in the X-axis direction and increases to the positive side in the Y-axis direction with the increase in the contact area between the finger 32 and the portable apparatus 31. As such the portable apparatus 31 including the proximity sensor device according to this embodiment can detect a change in the contact area between the portable apparatus 31 and the finger 32.

As such, in this embodiment, it is possible to detect a variation in the output of the proximity sensor due to a change in the holding state of the portable apparatus 31 with high sensitivity. In addition, when the capacitance-type proximity sensor device according to this embodiment is used in the portable apparatus 31, the output signals from the external electrodes 14*a* to 14*d* serving as detecting electrodes may be used to automatically calibrate a detection reference value (offset value). As the calibration process, for example, a predetermined threshold value is set depending on the intensity of the output signal from the detecting electrode and calibration is performed by software when the intensity of the signal is equal to or greater than the threshold value. However, the calibration process is not limited thereto.

In the structure in which calibration is automatically performed, for example, when the portable apparatus 31 provided with the proximity sensor device is held by the hand, particularly, two fingers 32, it may be in a sleep state. When the portable apparatus 31 is held by four fingers 32, it may automatically start up. In addition, when the proximity sensor device is provided in, for example, a mobile phone or a cordless telephone and the body of the mobile phone or the cordless telephone is held by the hand, the mobile phone or the cordless telephone may automatically change to a call state. Thus, according to the proximity sensor device according to this embodiment, when the proximity sensor device is used in, for example, a portable apparatus, it is easy to obtain the surrounding environment of the proximity sensor, such as a holding state, and it is possible to detect a very small change in capacitance.

Figure 11:
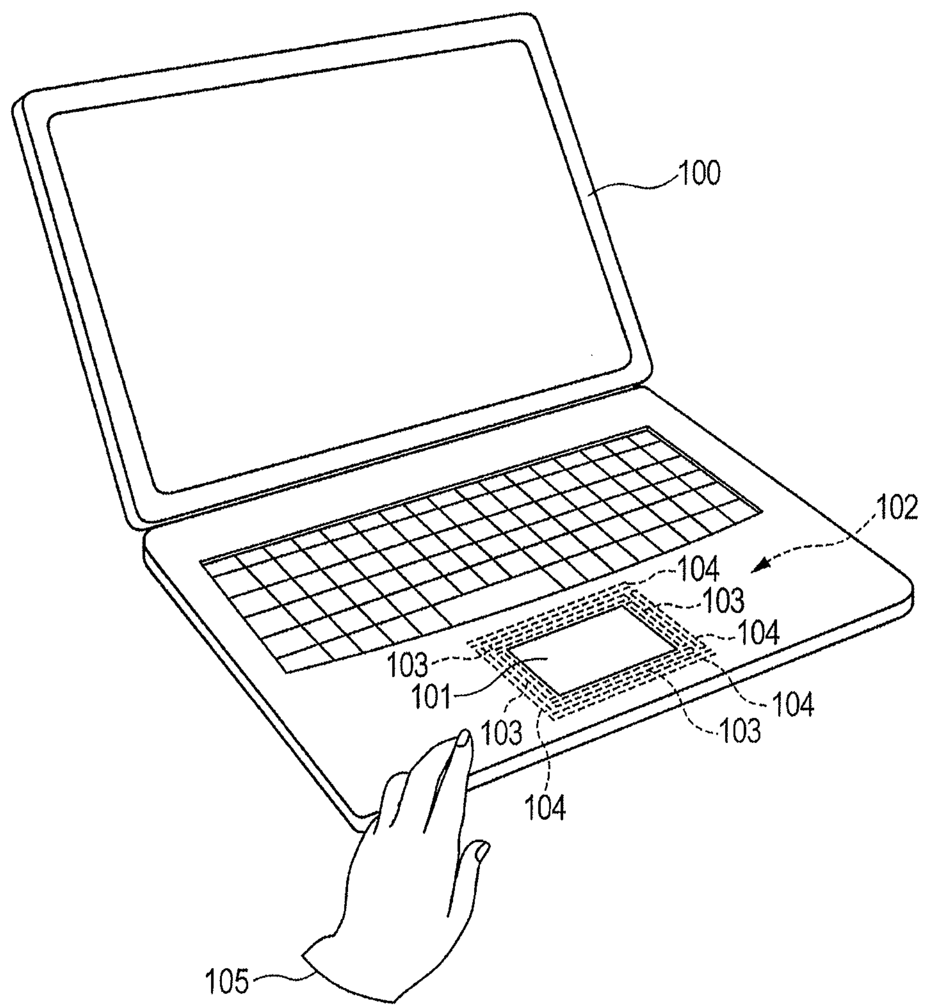
FIG. 11 is a diagram illustrating a notebook PC including the capacitance-type proximity sensor device according to this embodiment.

Next, applications of the capacitance-type proximity sensor device according to this embodiment will be described. FIG. 11 is a diagram illustrating a notebook PC (personal computer) including the capacitance-type proximity sensor device according to this embodiment. As shown in FIG. 11, a notebook PC 100 includes a sensor unit 102, which is the proximity sensor device according to this embodiment, provided in a touch pad 101. In this example, four internal electrodes 103 of the sensor unit 102 are provided in the vicinity of the center of the touch pad 101 and four external electrodes 104 are arranged around the four internal electrodes 103. For example, even when the operator performs an input operation while the body (not shown) is close to the notebook PC 100, this arrangement makes it possible to calibrate the capacitance-type proximity sensor device using the output signals from the external electrodes 104. As such, since the capacitance-type proximity sensor device can be appropriately calibrated according to the approach state of the operator, it is possible to accurately perform an input operation to the touch pad 101 with the hand 105. As in the example shown in FIG. 11, for example, when the notebook PC 100 is used, the external electrodes 104 are not necessarily arranged in the outer circumference of the internal electrodes 103, but the external electrodes 104 may be arranged at least on the front side of the notebook PC 100. In this case, it is possible to reduce the influence of external noise by the approach of the operator.

Figure 12A:
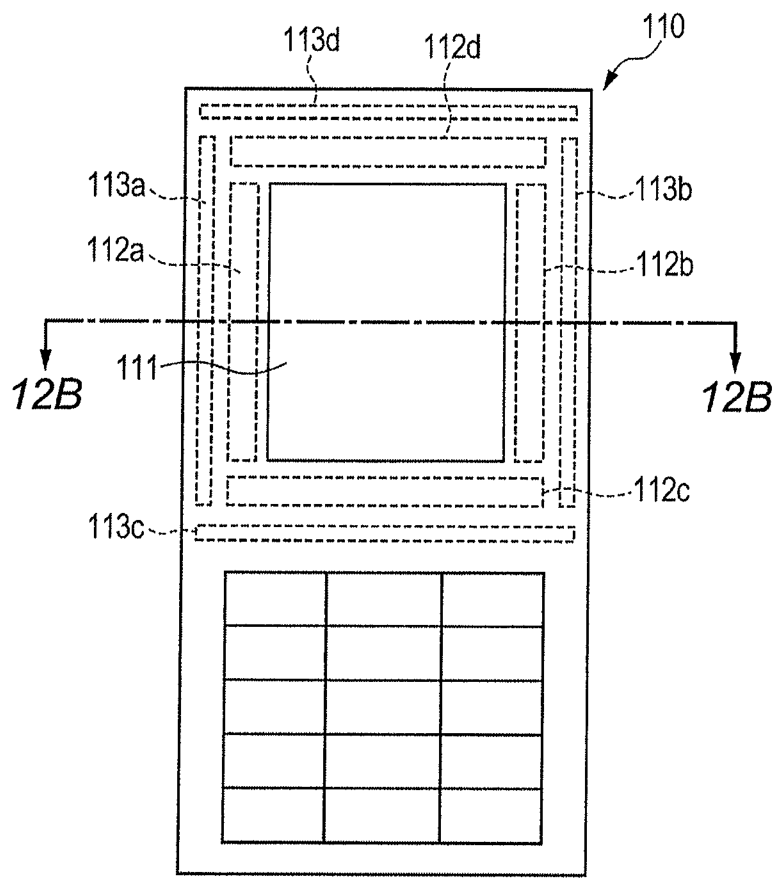
FIG. 12A is a schematic plan view illustrating a mobile phone including the capacitance-type proximity sensor device according to the embodiment of the invention.

FIG. 12A is a plan view schematically a mobile phone including the capacitance-type proximity sensor device according to the embodiment of the invention. As shown in FIG. 12A, a mobile phone 110 includes a rectangular liquid crystal display unit 111, four internal electrodes 112*a* to 112*d* which are arranged around the liquid crystal display unit 111, and four external electrodes 113*a* to 113*d* which are arranged in the outer circumference of the internal electrodes 112*a* to 112*d*.

Figure 12B:
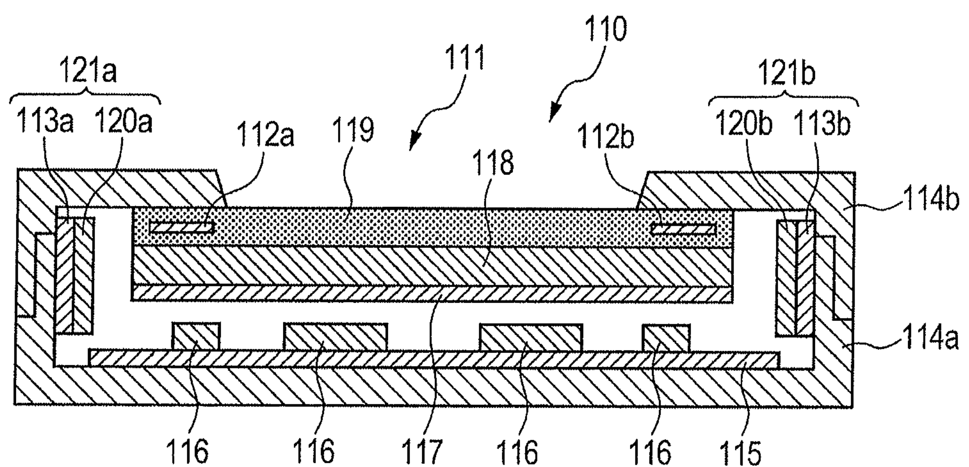
FIG. 12B is a cross-sectional view illustrating the mobile phone including the capacitance-type proximity sensor device according to this embodiment.

FIG. 12B is a cross-sectional view taken along the line B-B of FIG. 12A. FIG. 12B shows the enlarged cross-section of the mobile phone 110. As shown in FIG. 12B, the mobile phone 110 includes a lower housing 114*a* and an upper housing 114*b* having a rectangular opening portion corresponding to the liquid crystal display unit 111. A substrate 115 is provided on the inner bottom of the lower housing 114*a* and electronic devices 116 are provided on the upper surface of the substrate 115. A lower electrode 117 which shields noise from the electronic devices 116 is provided above the substrate 115 so as to be separated from the electronic devices 116 provided on the substrate 115.

An LCD module 118 is provided on the upper surface of the lower electrode 117 so as to cover the edge of the liquid crystal display unit 111. A touch panel 119 having an area corresponding to the LCD module 118 is provided between the upper surface of the LCD module 118 and the upper housing 114*b*. Internal electrodes 112*a* and 112*b* are provided in the touch panel 119 at positions corresponding to the outer edge of the liquid crystal display unit 111.

A two-layer flexible substrate 121*a* including an external electrode 113*a* and a shielding electrode 120*a* is provided on one inner side surface of the lower housing 114*a* and the upper housing 114*b*. The external electrode 113*a* of the two-layer flexible substrate 121*a* is provided on the inner side surface of the lower housing 114*a* and the upper housing 114*b* so as to be separated from the substrate 115. The shielding electrode 120*a* is provided on the main surface of the external electrode 113*a* close to the lower electrode 117 so as to be separated from the lower electrode 117. A two-layer flexible substrate 121*b* including an external electrode 113*b* and a shielding electrode 120*b* is provided on the other inner side surface of the lower housing 114*a* and the upper housing 114*b*. The external electrode 113*b* of the two-layer flexible substrate 121*b* is provided on the inner side surface of the lower housing 114*a* and the upper housing 114*b* so as to be separated from the substrate 115. The shielding electrode 120*b* is provided on the main surface of the external electrode 113*b* close to the lower electrode 117 so as to be separated from the lower electrode 117. The shielding electrodes 120*a* and 120*b* and the lower electrode 117 are constantly connected to the ground and the shielding electrodes 120*a* and 120*b* are configured to reduce the influence of external noise on the internal electrodes 112*a* and 112*b*. Thus, a combination of the external electrodes 113*a* and 113*b* and the shielding electrodes 120*a* and 120*b* makes it possible to effective reduce external noise. In addition, the shielding electrodes 120*a* and 120*b* are not necessarily provided, but only the external electrodes 113*a* and 113*b* may be provided on the inner side surface of the lower housing 114*a* and the upper housing 114*b*.

As such, when the internal electrodes 112*a* to 112*d* are arranged around the liquid crystal display unit 111 of the mobile phone 110, it is possible to detect, for example, the fingers of the operator in the liquid crystal display unit 111 and use the liquid crystal display unit 111 as a touch pad. In addition, when the external electrodes 113*a* to 113*d* are arranged in the outer circumference of the internal electrodes 112*a* to 112*d* and are used as the shielding electrodes and/or the detecting electrodes, it is possible to shield external noise for the liquid crystal display unit 111 and correct input accuracy due to a change in the touch state of the finger with the liquid crystal display unit 111. Therefore, it is possible to perform an accurate input operation, regardless of the influence of external noise on the mobile phone 110 or a change in the holding state of the mobile phone 110. In addition, it is possible to use the change in the holding state for other input operations.

The capacitance-type proximity sensor device according to this embodiment can be applied to other various kinds of electronic apparatuses. For example, when the capacitance-type proximity sensor device is provided in a digital photo frame, in some cases, it is affected by external noise from a stand of the digital photo frame, or an offset value is shifted when the digital photo frame is moved. In this case, the capacitance-type proximity sensor device according to this embodiment is provided such that the external electrodes are arranged close to the stand, with respect to the internal electrode, which makes it possible to reduce the influence of external noise from the stand of the digital photo frame. In addition, even when the digital photo frame is moved, it is possible to detect the shift of the offset value. Therefore, it is possible to automatically perform calibration.

The capacitance-type proximity sensor device according to this embodiment can be applied to a television broadcast receiver. In the television broadcast receiver, for example, when the person passes by a screen of the television broadcast receiver, the proximity sensor is greatly affected. In this case, grounding is performed such that the external electrodes are arranged around the screen of the television broadcast receiver. In this way, it is possible to reduce the influence of external noise. When an external noise source is placed in the vicinity of the television broadcast receiver, it is possible to automatically perform calibration according to a capacitance variation.

As described above, according to the capacitance-type proximity sensor device of this embodiment, in the sensor unit 11, the external electrodes 14*a* to 14*d* arranged outside the internal electrodes 13*a* to 13*d* are used as shielding electrodes which shield the internal electrodes 13*a* to 13*d* from external noise and are also used as driving electrodes and detecting electrodes which detect the object to be detected. Therefore, it is possible to detect two different kinds of object position information. The obtained two kinds of object position information are detected by the internal electrodes 13*a* to 13*d* and the external electrodes 14*a* to 14*d* in different surrounding environments. Therefore, the use of each of the object position information items makes it possible to correct the position of the object to be detected, and reduce and correct the influence of external noise.

In particular, in this embodiment, the object position information obtained by detection with the internal electrodes 13*a* to 13*d* is corrected using the object position information obtained by detection with the external electrodes 14*a* to 14*d*. Therefore, it is possible to detect whether there is an object to be detected in the detection region and detect the position of the object to be detected with high accuracy. In this way, for example, when the capacitance-type proximity sensor device is provided in a portable apparatus, it is possible to detect a change in the holding state of the portable apparatus by, for example, the hand with high accuracy.

The invention is not limited to the above-described embodiment, but various modifications of the invention can be made. In the above-described embodiment, eight electrodes are used as the detecting electrodes and the driving electrodes, but the invention is not limited thereto. For example, electrodes other than the eight electrodes may be used. In addition, in the above-described embodiment, the left and right sides, the upper and lower sides, the front and rear sides, the dimensions of the members, and the position, size, and shape of the members may be appropriately changed. Furthermore, various modifications and changes of the invention can be made without departing from the scope of the object of the invention.

The invention can be applied to various input devices, such as the operation panels of a portable apparatus, a digital photo frame, a PC, and an audio system.

It should be understood by those skilled in the art that various modifications, combinations, sub-combinations and alterations may occur depending on design requirements and other factors insofar as they are within the scope of the appended claims of the equivalents thereof.

What is claimed is:

1. A capacitance-type proximity sensor device comprising:

a plurality of internal electrodes including a pair of X-axis internal electrodes that are arranged in a detection reference plane such that capacitance is formed between adjacent electrodes and are opposite to each other in an X-axis direction included in the detection reference plane and a pair of Y-axis internal electrodes that are arranged so as to be opposite to each other in a Y-axis direction which is included in the detection reference plane and is perpendicular to the X-axis direction;

external electrodes that are arranged in the outer circumference of the plurality of internal electrodes such that capacitance is formed between adjacent electrodes;

a driving circuit that outputs a driving voltage applied to an electrode serving as a driving electrode among the plurality of internal electrodes and the external electrodes;

a detecting circuit that detects a signal output from an electrode serving as a detecting electrode among the plurality of internal electrodes and the external electrodes;

a calculating unit that calculates the position of an object to be detected in the X-axis direction and the Y-axis direction of the object to be detected and a Z-axis direction perpendicular to the reference plane from the detection result of the detecting circuit; and a switching unit that connects the electrode serving as the driving electrode to the driving circuit, connects the electrode serving as the detecting electrode to the detecting circuit, and connects an electrode serving as a shielding electrode among the plurality of internal electrodes and the external electrodes to the ground.

2. The capacitance-type proximity sensor device according to claim 1, wherein the external electrode protrudes from a detection surface of the plurality of internal electrodes in the Z-axis direction.

3. The capacitance-type proximity sensor device according to claim 1, wherein the external electrode includes an extension portion that extends to as to be bent to the internal electrode at a height position in the vicinity of the detection surface of the plurality of internal electrodes.

4. The capacitance-type proximity sensor device according to claim 1, wherein the external electrodes include:

a pair of X-axis external electrodes that are arranged outside the pair of X-axis internal electrodes so as to be opposite to each other; and a pair of Y-axis external electrodes that are arranged outside the pair of Y-axis internal electrodes so as to be opposite to each other.

5. The capacitance-type proximity sensor device according to claim 1, wherein, in a first detection pattern, the pair of X-axis internal electrodes and a pair of X-axis external electrodes are connected as the detecting electrodes to the detecting circuit, and the pair of Y-axis internal electrodes and a pair of Y-axis external electrodes are connected as the driving electrodes to the driving circuit, and connection states of each pair of internal electrodes and each pair of external electrodes are changed depending on a detection target direction such that the pairs of electrodes serve as the detecting electrodes or the driving electrodes.

6. The capacitance-type proximity sensor device according to claim 1, wherein, in a first detection pattern, at least one of the internal electrodes and the external electrode which is arranged outside the internal electrode are connected as the detecting electrodes to the detecting circuit, the other internal electrodes and the other external electrodes are connected as the driving electrodes to the driving circuit, and sets of the internal electrodes and the external electrodes serving as the detecting electrodes and the driving electrodes are sequentially changed to perform detection.

7. The capacitance-type proximity sensor device according to claim 1, wherein, in a first detection pattern, at least one of the internal electrodes and the external electrode which is arranged outside the internal electrode are connected as the detecting electrodes to the detecting circuit, the other internal electrodes and the other external electrodes are connected as the driving electrodes to the driving circuit, and sets of the internal electrodes and the external electrodes serving as the detecting electrodes and the driving electrodes are sequentially changed to perform detection.

8. An electronic apparatus comprising the capacitance-type proximity sensor device according to claim 1.

9. The capacitance-type proximity sensor device according to claim 1, wherein the switching unit changes connection states of the plurality of internal electrodes and the external electrodes in correspondence with a first detection pattern in which at least one of the plurality of internal electrodes is connected as the detecting electrode to the detecting circuit and at least one of the external electrodes is connected as the shielding electrode to the ground and a second detection pattern in which at least one of the external electrodes is connected as the detecting electrode to the detecting circuit, and the calculating unit calculates the position of the object to be detected using a first object position information item detected in the first detection pattern and a second object position information item detected in the second detection pattern.

10. The capacitance-type proximity sensor device according to claim 9, wherein the external electrode protrudes from a detection surface of the plurality of internal electrodes in the Z-axis direction.

11. The capacitance-type proximity sensor device according to claim 9, wherein the external electrode includes an extension portion that extends so as to be bent to the internal electrode at a height position in the vicinity of the detection surface of the plurality of internal electrodes.

12. The capacitance-type proximity sensor device according to claim 9, wherein the external electrodes include:

a pair of X-axis external electrodes that are arranged outside the pair of X-axis internal electrodes so as to be opposite to each other; and a pair of Y-axis external electrodes that are arranged outside the pair of Y-axis internal electrodes so as to be opposite to each other.

13. The capacitance-type proximity sensor device according to claim 9, wherein, in the second detection pattern, each pair of internal electrodes are connected as the shielding electrodes to the ground, the pair of X-axis external electrodes are connected as the detecting electrodes to the detecting circuit, the pair of Y-axis external electrodes are connected as the driving electrodes to the driving circuit, and the connection state of each pair of external electrodes is changed depending on a detection target direction such that the pair of external electrodes serve as the detecting electrodes or the driving electrodes.

14. The capacitance-type proximity sensor device according to claim 9, wherein, in the first detection pattern, each pair of external electrodes are connected as the shielding electrodes to the ground, the pair of X-axis internal electrodes are connected as the detecting electrodes to the detecting circuit, the pair of Y-axis internal electrodes are connected as the driving electrodes to the driving circuit, and the connection state of each pair of internal electrodes is changed depending on the detection target direction such that the pair of internal electrodes serve as the detecting electrodes or the driving electrodes.

15. The capacitance-type proximity sensor device according to claim 9, wherein, in the first detection pattern, in detection in the X-axis direction, one of the pair of X-axis internal electrodes and one of the pair of X-axis external electrodes which is arranged close to the other of the pair of X-axis internal electrodes form a first pair of internal and external electrodes, and the other of the pair of X-axis internal electrodes and the other of the pair of X-axis external electrodes which is arranged close to the one X-axis internal electrode of the pair of X-axis internal electrodes form a second pair of internal and external electrodes, the pair of Y-axis external electrodes are connected as the shielding electrodes to the ground, and the pair of Y-axis internal electrodes are connected as the driving electrodes to the driving circuit, the connection state is changed between a first connection state in which the first pair of internal and external electrodes serve as the detecting electrodes and the second pair of internal and external electrodes serve as the shielding electrodes and a second connection state in which the second pair of internal and external electrodes serve as the detecting electrodes and the first pair of internal and external electrodes serve as the shielding electrodes to perform detection, and the connection of each pair of internal electrodes, the pair of external electrodes, and the first and second pairs of internal and external electrodes is changed depending on the detection target direction.

16. The capacitance-type proximity sensor device according to claim 9, wherein, in the first detection pattern, each pair of external electrodes are connected as the shielding electrodes to the ground, at least one of the internal electrodes is connected as the detecting electrode to the detecting circuit, the other internal electrodes are connected as the driving electrodes to the driving circuit, and the internal electrodes serving as the detecting electrodes and the driving electrodes are sequentially changed to perform detection.

17. An electronic apparatus comprising the capacitance-type proximity sensor device according to claim 9.

18. An electrode driving method that is performed in a capacitance-type proximity sensor device including: a plurality of internal electrodes including a pair of X-axis internal electrodes that are arranged in a reference plane such that capacitance is formed between adjacent electrodes and are opposite to each other in an X-axis direction included in the reference plane and a pair of Y-axis internal electrodes that are arranged so as to be opposite to each other in a Y-axis direction which is included in the reference plane and is perpendicular to the X-axis direction; external electrodes that are arranged in the outer circumference of the plurality of internal electrodes such that capacitance is formed between adjacent electrodes; a driving circuit that outputs a driving voltage applied to an electrode serving as a driving electrode among the plurality of internal electrodes and the external electrodes; a detecting circuit that detects a signal output from an electrode serving as a detecting electrode among the plurality of internal electrodes and the external electrodes; and a calculating unit that calculates the position of an object to be detected in the X-axis direction and the Y-axis direction of the object to be detected and a Z-axis direction perpendicular to the reference plane from the detection result of the detecting circuit, the method comprising:

changing a connection state of the external electrodes depending on a detection pattern such that the external electrodes serve as the shielding electrodes or the detecting electrodes.

* * * * *